US012327068B2

(12) United States Patent
Miyamoto et al.

(10) Patent No.: US 12,327,068 B2
(45) Date of Patent: Jun. 10, 2025

(54) MEASUREMENT TABLES INCLUDING TARGET IDENTIFICATION INFORMATION INDICATING A MEASUREMENT TARGET

(71) Applicant: LENOVO (Singapore) PTE. LTD., New Tech Park (SG)

(72) Inventors: Tabito Miyamoto, Yokohama (JP); Eiji Shinohara, Yokohama (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 849 days.

(21) Appl. No.: 17/159,790

(22) Filed: Jan. 27, 2021

(65) Prior Publication Data

US 2021/0232717 A1 Jul. 29, 2021

(30) Foreign Application Priority Data

Jan. 29, 2020 (JP) .................................. 2020-12915

(51) Int. Cl.
*G06F 30/10* (2020.01)
(52) U.S. Cl.
CPC .................. *G06F 30/10* (2020.01)
(58) Field of Classification Search
CPC ... G06F 30/10; G06T 19/00; G05T 19/41875; G05B 19/4063
USPC ....................................................... 702/155
See application file for complete search history.

(56) References Cited

U.S. PATENT DOCUMENTS

2016/0253081 A1* 9/2016 Bains .................. G06F 3/04842
715/771
2023/0237641 A1* 7/2023 Horita .................... G06Q 50/08
382/141

FOREIGN PATENT DOCUMENTS

JP        05282388 A      10/1993
JP        H0886834 A    *  4/1996

OTHER PUBLICATIONS

English translation of Jp H0886834, Apr. 1996. (Year: 1996).*
(Continued)

*Primary Examiner* — Michael P Nghiem
(74) *Attorney, Agent, or Firm* — Kunzler Bean & Adamson

(57) ABSTRACT

Methods for generating a measurement table including target identification information indicating a measurement target are disclosed herein. One method includes adding, by a processor, attribute information for a dimension value of a measurement target included in drawing data and a delimiter for identifying number information for the dimension value to the dimension value, adding the number information including a drawing sheet number and a dimension number for the measurement target to the delimiter, and generating a measurement table including target identification information indicating the measurement target corresponding to the drawing data and inspection standards based on dimension addition information. The attribute information is associated with the number information added to the delimiter and is based on the dimension value of the measurement target. Apparatus and systems that can perform the methods generating a measurement table including target identification information indicating the measurement target are also disclosed herein.

20 Claims, 14 Drawing Sheets

(56) References Cited

OTHER PUBLICATIONS

Sathi et al. ("STEP to DMIS: Automated Generation of Inspection Plans from CAD Data"), 2009, pp. 519-524. (Year: 2009).*
Ali et al. ("Feature-based design approach for integrated CAD and computer-aided inspection planning"), 2015, pp. 2159-2183. (Year: 2015).*

* cited by examiner

| DIMENSION RANGE (mm) | TOLERANCE (mm) |
|---|---|
| L ≤ 5.0 | ±0.05 |
| 5.0 < L ≤ 20.0 | ±0.10 |
| 20.0 < L ≤ 50.0 | ±0.15 |
| 50.0 < L | ±0.20 |

| DIMENSION ADDITION TAG | DIMENSION ATTRIBUTE | SHEET NUMBER | DIMENSION NUMBER | DIMENSION VIEW | DIMENSION TYPE | DIMENSION POST TAG | DIMENSION | TOLERANCE FLAG | TOLERANCE UPPER LIMIT | TOLERANCE LOWER LIMIT | UPPER LIMIT DIMENSION VALUE | LOWER LIMIT DIMENSION VALUE | MEASURED VALUE | | ... |
|---|---|---|---|---|---|---|---|---|---|---|---|---|---|---|---|
| | | | | | | | | | | | | | FIRST | SECOND | |
| @[1-1] | @ | 1 | 1 | FRONT VIEW | Dst[mm] | | 15 | U | 0.1 | -0.1 | 15.1 | 14.9 | | | ... |
| @[1-3] | @ | 1 | 3 | LEFT VIEW | Dst[mm] | | 10 | U | 0.1 | -0.1 | 10.1 | 9.9 | | | ... |
| ... | ... | ... | ... | ... | ... | ... | ... | ... | ... | ... | ... | ... | ... | ... | ... |
| *[1-2] | * | 1 | 2 | FRONT VIEW | Dst[mm] | | 3 | | 0.05 | -0.05 | 3.05 | 2.95 | | | ... |
| ... | ... | ... | ... | ... | ... | ... | ... | ... | ... | ... | ... | ... | ... | ... | ... |
| [2-2] (5X) | | 2 | 2 | FRONT VIEW | Dst[mm] | (5X) | 30 | | 0.15 | -0.15 | 30.15 | 29.85 | | | ... |
| ... | ... | ... | ... | ... | ... | ... | ... | ... | ... | ... | ... | ... | ... | ... | ... |

FIG. 4

| DIMENSION ADDITION TAG | | DIMENSION VALUE | TOLERANCE | DIMENSION POST TAG | POSITION COORDINATES | |
|---|---|---|---|---|---|---|
| ATTRIBUTE INFORMATION | NUMBERING INFORMATION | | | | X-AXIS COORDINATE | Y-AXIS COORDINATE |
| "@","*"," " | [S-N] | OOO.OO | ±O.OO | (2X) OR THE LIKE | OOOO.OO | OOO.OO |

FIG. 5

MEASUREMENT TABLES INCLUDING TARGET IDENTIFICATION INFORMATION INDICATING A MEASUREMENT TARGET

REFERENCE TO RELATED APPLICATION

This application claims priority to Japanese Patent Application No. JP2020-12915, filed on Jan. 29, 2020, the contents of which are incorporated herein by reference, in their entirety.

FIELD

The subject matter disclosed herein relates to inspection support devices, inspection support systems, inspection support methods, and data structures.

DESCRIPTION OF THE RELATED ART

Manufactured parts or the like items are typically manufactured based on drawings created by computer-aided design (CAD) software in which a supplier/manufacturer has manually numbered and extracted measurement points from the drawings to create a measurement table, such as a first article inspection (FAI) table. To improve such a complicated inspection work, there has been proposed techniques that automatically number the measurement points from the drawing data to create a measurement table. However, in conventional techniques the measurement points are uniformly extracted and numbered, which makes it difficult to extract and number measurement points for measuring purposes in a flexible manner.

BRIEF SUMMARY

Apparatus and systems for generating a measurement table including target identification information indicating a measurement target are disclosed herein. One apparatus includes an attribute addition processing unit that adds attribute information for a dimension value of a measurement target included in drawing data and a delimiter for identifying number information for the dimension value to the dimension value, a numbering processing unit that adds the number information including a drawing sheet number and a dimension number for the measurement target to the delimiter, and a measurement table generation unit that generates a measurement table including target identification information indicating the measurement target corresponding to the drawing data and inspection standards based on dimension addition information. In certain embodiments, the attribute information is associated with the number information added to the delimiter and is based on the dimension value of the measurement target and at least a portion of each of said attribute addition processing unit, said numbering processing unit, and said measurement table generation unit comprises one or more of a set of hardware circuits, a set of programmable hardware devices, and executable code stored on a set of non-transitory computer-readable storage media.

A system includes a display device, a processor coupled to the display device, and a memory device coupled to the processor. The memory device is configured to store an attribute addition processing unit that adds attribute information for a dimension value of a measurement target included in drawing data and a delimiter for identifying number information for the dimension value to the dimension value, a numbering processing unit that adds the number information including a drawing sheet number and a dimension number for the measurement target to the delimiter, and a measurement table generation unit that generates a measurement table including target identification information indicating the measurement target corresponding to the drawing data and inspection standards based on dimension addition information. In certain embodiments, the attribute information is associated with the number information added to the delimiter and is based on the dimension value of the measurement target and at least a portion of each of said attribute addition processing unit, said numbering processing unit, and said measurement table generation unit comprises one or more of a set of hardware circuits, a set of programmable hardware devices, and executable code stored on a set of non-transitory computer-readable storage media.

Methods for generating a measurement table including target identification information indicating a measurement target are also disclosed herein. One method includes adding, by a processor, attribute information for a dimension value of a measurement target included in drawing data and a delimiter for identifying number information for the dimension value to the dimension value, adding the number information including a drawing sheet number and a dimension number for the measurement target to the delimiter, and generating a measurement table including target identification information indicating the measurement target corresponding to the drawing data and inspection standards based on dimension addition information. In certain embodiments, the attribute information is associated with the number information added to the delimiter and is based on the dimension value of the measurement target.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 4 is a diagram illustrating a data example of one embodiment of a measurement table storage unit included in the inspection support system of FIG. 1;

FIG. 5 is a diagram illustrating an example of one embodiment of a data structure of dimension information;

DETAILED DESCRIPTION

Figure 1:
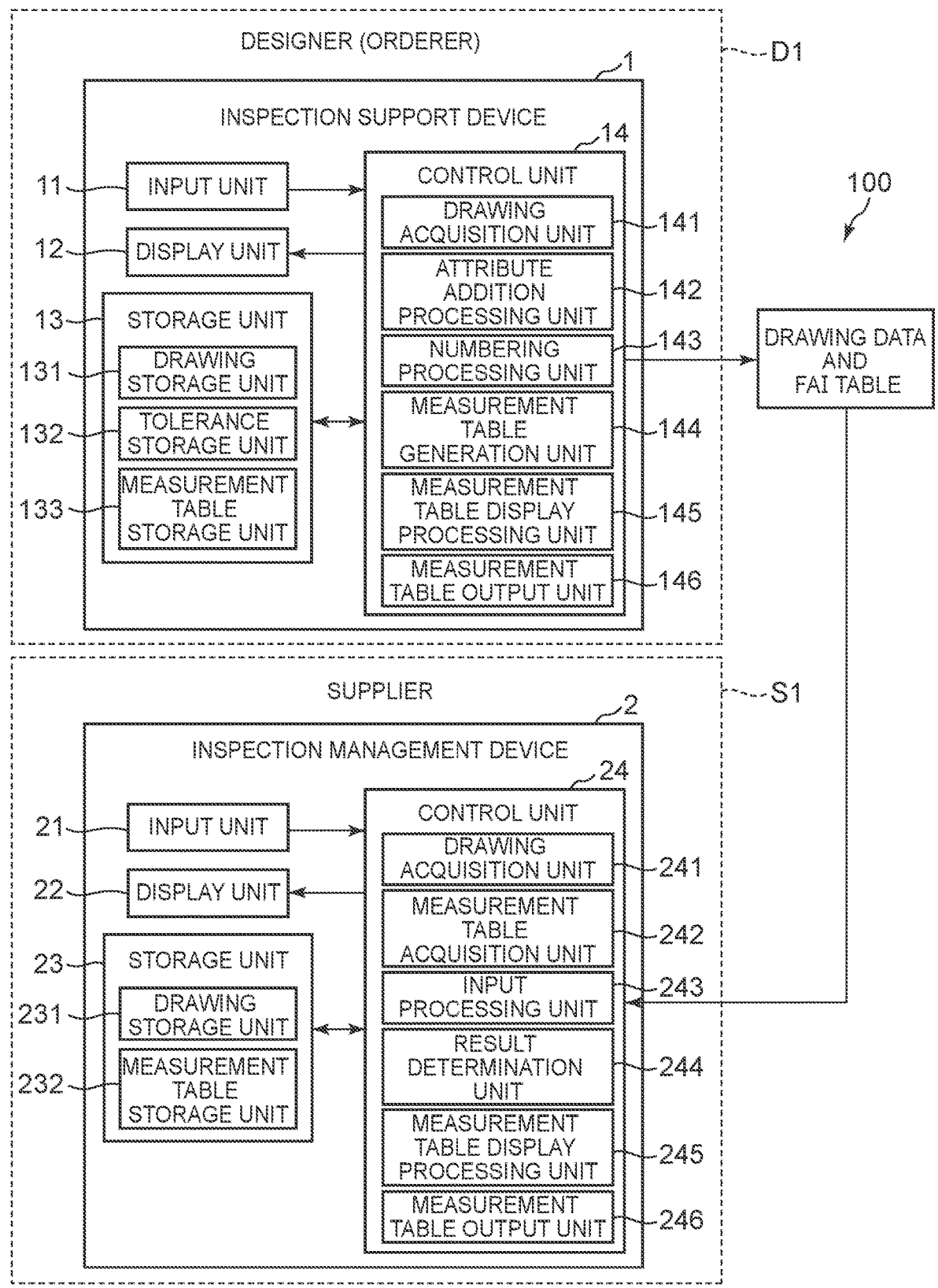
FIG. 1 is a functional block diagram illustrating one embodiment of an inspection support system.

As will be appreciated by one skilled in the art, aspects of the embodiments may be embodied as a system, apparatus, method, or program product. Accordingly, embodiments may take the form of an entirely hardware embodiment, an entirely software embodiment (including firmware, resident software, micro-code, etc.) or an embodiment combining software and hardware aspects that may all generally be referred to herein as a circuit, module, or system. Furthermore, embodiments may take the form of a program product embodied in one or more computer-readable storage devices storing machine readable code, computer-readable code, and/or program code, referred hereafter as code. The storage devices may be tangible, non-transitory, and/or non-transmission. The storage devices may not embody signals. In a certain embodiment, the storage devices only employ signals for accessing code.

Certain of the functional units described in this specification have been labeled as modules, to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, include one or more physical or logical blocks of executable code which may, for instance, be organized as an object, procedure, or function. Nevertheless, the executables of an identified module need not be physically located together, but may include disparate instructions stored in different locations which, when joined logically together, include the module and achieve the stated purpose for the module.

Indeed, a module of code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different computer-readable storage devices. Where a module or portions of a module are implemented in software, the software portions are stored on one or more computer-readable storage devices.

Any combination of one or more computer-readable media may be utilized. The computer-readable medium/media may include one or more computer-readable storage media. The computer-readable storage medium/media may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (e.g., a non-exhaustive and/or non-limiting list) of the storage device would include the following: an electrical connection having one or more wires, a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

Code for carrying out operations for embodiments may be written in any combination of one or more programming languages including an object-oriented programming language such as Python, Ruby, Java, Smalltalk, C++, or the like, and conventional procedural programming languages, such as the C programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to one embodiment, an embodiment, or similar language means that a particular feature, structure, or characteristic described in connection with the embodiment is included in at least one embodiment. Thus, appearances of the phrases in one embodiment, in an embodiment, and similar language throughout this specification may, but do not necessarily, all refer to the same embodiment, but mean one or more but not all embodiments unless expressly specified otherwise. The terms including, comprising, having, and variations thereof mean including but not limited to, unless expressly specified otherwise. An enumerated listing of items does not imply that any or all of the items are mutually exclusive, unless expressly specified otherwise. The terms a, an, and the also refer to one or more unless expressly specified otherwise.

In addition, as used herein, the term set can mean one or more, unless expressly specified otherwise. The term sets can mean multiples of or a plurality of one or mores, ones or more, and/or ones or mores consistent with set theory, unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. The code may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational blocks to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which includes one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other blocks and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated blocks of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The various embodiments discussed herein solve at least some of the issues in conventional inspection techniques and provide inspection support devices, inspection support systems, inspection support methods, and data structures capable of increasing convenience in inspection work. Further, the various embodiments discussed herein can increase the convenience in inspection work of manufactured parts.

To solve some of the issues in conventional inspection techniques, an inspection support device according to certain embodiments includes an attribute addition processing unit that adds attribute information of a dimension value of a measurement target included in drawing data and a delimiter for identifying number information of the dimension value to the dimension value and a numbering processing unit that adds the number information including a drawing sheet number and a dimension number of the measurement target to the delimiter. The inspection support device further includes a measurement table generation unit that generates a measurement table containing target identification information indicating the measurement target corresponding to the drawing data and inspection standards based on dimension addition information in which the attribute information is associated with the number information added to the delimiter and based on the dimension value of the measurement target.

In some inspection support devices, the inspection standards may include the dimension value of the measurement target and a tolerance of the dimension value and the measurement table generation unit may generate the measurement table by using an added tolerance in the case where the tolerance is added to the dimension value of the measurement target in the drawing data. In additional or alternative embodiments, the inspection support device includes a tolerance storage unit that stores a range of the dimension value and the tolerance in association with each other in which the measurement table generation unit may acquire the tolerance corresponding to the dimension value of the measurement target from the tolerance storage unit for situations in which the tolerance is not added to the dimension value of the measurement target in the drawing data and may generate the measurement table by using the acquired tolerance.

In various embodiments of the inspection support device, the numbering processing unit may add the number information to the delimiter and the number information being provided by any one of the processes includes: a first process of providing the number information in the order of dimensions of the measurement target specified on the drawing displayed on the display unit, a second process of providing the number information in a predetermined order based on the position of the dimension on the drawing displayed on the display unit, and a third process of providing the number information in the order in which the delimiter is added to the drawing displayed on the display unit. In further embodiments of the inspection support device, the numbering processing unit may perform a shift process of shifting the dimension number by changing the dimension number to a value obtained by adding a specified number of shifts to the dimension number for situations in which the dimension number is equal to or greater than the specified dimension number.

In the inspection support device according to certain embodiments, the target identification information may include the attribute information and the number information and the measurement table generation unit may generate the measurement table containing the attribute information, the number information, and the inspection standards for each of the measurement targets. In the inspection support device according to further embodiments, the attribute information may include importance information indicating the importance of measurement or management specification information indicating the measurement target for which a process capability index is calculated.

According to some embodiments, the inspection support device may further include a display processing unit that displays a drawing indicated by the drawing data and the measurement table generated by the measurement table generation unit on the display unit, visibly displays the positions of the target identification information and the inspection standards on the measurement table corresponding to the dimension of the measurement target specified in the drawing, and visibly displays the position of the dimension of the measurement target in the drawing corresponding to the target identification information and the inspection standards specified in the measurement table. In additional or alternative embodiments, the inspection support device includes an inspection management device that displays a drawing indicated by the drawing data and the measurement table generated by the measurement table generation unit on the display unit, visibly displays the positions of the target identification information and the inspection standards on the measurement table corresponding to the dimension of the measurement target specified in the drawing, and visibly displays the position of the dimension of the measurement target in the drawing corresponding to the target identification information and the inspection standards specified in the measurement table. In certain embodiments, the inspection management device may include an input processing unit that adds a measured value of the dimension of the measurement target to the measurement table in which the measured value is input from an input unit and a determination processing unit that determines an inspection result of the dimension of the measurement target based on the inspection standards in the measurement table with the measured value added by the input processing unit and based on the measured value.

An inspection support method according to various embodiments includes an attribute addition process in which an attribute addition processing unit adds attribute information of a dimension value of a measurement target included in drawing data and a delimiter for identifying number information of the dimension value to the dimension value and a numbering process in which a numbering processing unit adds the number information including a drawing sheet number and a dimension number of the measurement target to the delimiter. The inspection support method further includes a measurement table generation process in which a measurement table generation unit generates a measurement table containing target identification information indicating the measurement target corresponding to the drawing data and inspection standards based on dimension addition information in which the attribute information is associated with the number information added to the delimiter and on the basis of the dimension value of the measurement target.

A data structure of drawing data according to various embodiments includes location information in a drawing representing a measurement target, a dimension value of the measurement target, attribute information of the dimension value and number information of the dimension value with a delimiter added for identifying the number information of the dimension value. The attribute information can further include a drawing sheet number and a dimension number of the measurement target.

Turning now to the drawings, FIG. 1 is a functional block diagram illustrating one embodiment of an inspection support system 100. As illustrated in FIG. 1, the inspection support system 100 includes, among other components, an inspection support device 1 and an inspection management device 2.

The inspection support device 1, which is a device owned by a designer D1 of parts (e.g., a person that orders the numbers on parts) or the like, is used by the designer D1 to create drawings of parts or the like and automatically generates a first article inspection (FAI) table (an example of a measurement table) based on the drawings. In addition, the inspection management device 2, which is a device owned by a supplier S1, inputs the measured values to the FAI table generated by the inspection support device 1 and displays a drawing and a FAI table to confirm inspection results. The inspection support device 1 and the inspection management device 2 can be, for example, information processing devices, such as personal computers (PCs).

In certain embodiments, the designer D1 can indicates an organization (e.g., a company) that designs drawings or a person who belongs to the organization and further indicate, for example, an organization (e.g., a company) that orders parts on the drawings or a person who belongs to the organization. Moreover, the supplier S1 can indicate an organization (e.g., a company) that manufactures parts on the basis of drawings and measures dimensions for inspection or a person who belongs to the organization.

At least in the illustrated embodiments, the inspection support device 1 includes an input unit 11, a display unit 12, a storage unit 13, and a control unit 14. The input unit 11 includes, for example, an input device such as a keyboard or a mouse. The input unit 11 accepts operations of a user, such as a designer D1, and accepts inputs of various data information.

The display unit 12 includes, for example, a display device, such as a liquid crystal display (LCD). The display unit 12 is configured to display various data information, such as drawings and FAI.

The storage unit 13 is configured to store various data and/or information used by the inspection support device 1. The storage unit 13 includes, for example, a drawing storage unit 131, a tolerance storage unit 132, and a measurement table storage unit 133, among other components that are possible and contemplated herein.

The drawing storage unit 131 is configured to store drawing data indicating a drawing. The drawing storage unit 131 further stores drawing data created by the designer D1, such as, for example, a drawing Z1, illustrated in FIG. 2.

Figures 2, 3:
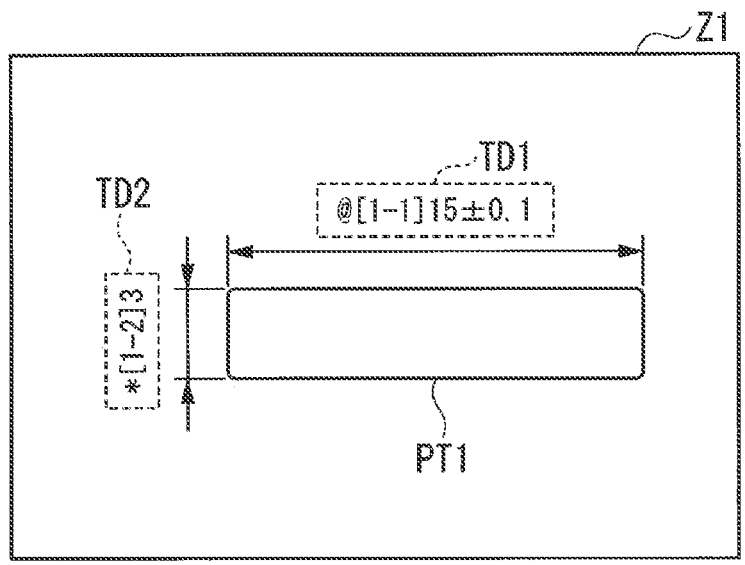
FIG. 2 is a diagram illustrating an example of a drawing stored by one embodiment of a drawing storage unit included in the inspection support system of FIG. 1.
FIG. 3 is a diagram illustrating a data example of one embodiment of a tolerance storage unit included in the inspection support system of FIG. 1.

FIG. 2 is a diagram illustrating an example of a drawing stored by the drawing storage unit 131 according to various embodiments. That is, the drawing Z1 illustrated in FIG. 2 can be a drawing of a part PT1, in which a dimension TD1 of a measurement target includes a dimension addition tag (an example of dimension addition information) of, "@[1-1]," which is added to the dimension TD1, and in which a dimension TD2 of the measurement target includes a dimension addition tag of, "*[1-2]," is added to the dimension TD2. Thus, in the drawing data in at least some embodiments, the dimension addition tag is added to the dimension of the measurement target and two-dimensional (2D) drawing data including a dimension with this type of dimension addition tag is stored in the drawing storage unit 131 in, for example, a portable document format (PDF) file or a drawing exchange format (DXF) file. The details of the dimension with the dimension addition tag are described elsewhere herein with reference to FIG. 5.

Returning to the description of FIG. 1, the tolerance storage unit 132, which is a storage unit that stores a general tolerance, is configured to store the range of the dimension values in association with the general tolerance. The general tolerance stored in the tolerance storage unit 132 applies in situations in which no tolerance or zero tolerance is added to the dimension(s) in the drawing. Here, a data example of the tolerance storage unit 132 is described with reference to FIG. 3.

FIG. 3 is a diagram illustrating the data example of the tolerance storage unit 132 in at least some embodiments. As illustrated in FIG. 3, the tolerance storage unit 132 is configured to stores a "dimension range (mm)" and a "tolerance (mm)" in association with each other. Here, the "dimension range (mm)" can mean a range of dimensions of a measurement target and the "tolerance (mm)" can mean the value(s) of a general tolerance.

For example, FIG. 3 illustrates that the general tolerance is +0.05 mm for a dimensional range (L≤5.0) in which the dimension L of the measurement target is less than or equal to 5.0 mm (millimeters). The example also illustrates that the general tolerance is +0.10 for a dimensional range (5<L≤20.0) in which the dimension L of the measurement target is greater than 5.0 mm and less than or equal to 20.0 mm. Thus, in various embodiments, the general tolerance can be set to a different value depending on the range of the dimension L of the measurement target.

Returning to the description of FIG. 1, the measurement table storage unit 133 is configured to store the FAI table generated from the drawing data stored in the drawing storage unit 131 by a measurement table generation unit 144, which is described elsewhere herein. The measurement table storage unit 133 is configured to store a FAI table that contains at least target identification information indicating the measurement target corresponding to the drawing data and inspection standards. The target identification information is the dimension addition tag described above and can include the attribute information and number information of the dimension of the measurement target.

FIG. 4 is a diagram illustrating a data example of one embodiment of the measurement table storage unit 133. As illustrated in FIG. 4, the measurement table storage unit 133 stores, for example, a "dimension addition tag," a "dimension attribute" (an example of attribute information), a "sheet number," a "dimension number," a "dimension view," a "dimension type," a "dimension post tag," a "dimension," a "tolerance flag," a "tolerance upper limit," a "tolerance lower limit," an "upper limit dimension value," and a "lower limit dimension value" associated with one another, as a FAI table.

In the above example, the "sheet number" and the "dimension number" indicate a drawing sheet number (e.g., a page number) and a dimension number in a sheet, and a combination of the "sheet number" and the "dimension number" creates a unique number information to be determined uniquely in the drawing. In addition, the "dimension view" indicates dimensional supplementary information such as a front view (FRONT VIEW), a side view (LEFT VIEW or the like), a rear view, an enlarged view, and a section view. In addition, the "dimension type" indicates the type of dimension, such as a straight-line distance and an angle. Further, the "tolerance flag" indicates whether a specified tolerance specified in the drawing is applied or a general tolerance is applied, and if the specified tolerance is applied, a "U" is entered. Moreover, the FAI display includes an additional "measured value" item in which measured values, which are measured by the supplier S1, are entered later.

The measurement table storage unit 133 stores the FAI table as illustrated in FIG. 4 in, for example, an Excel file format. Furthermore, the data structure of dimension information according to various embodiments included in the drawing data is described with reference to FIG. 5.

FIG. 5 is a diagram illustrating an example of one embodiment of a data structure of the dimension information. As illustrated in FIG. 5, the dimension information includes a data structure that indicates the dimension of drawing data, including "dimension addition tag" (e.g., a dimension prefix tag), "dimension value," "tolerance," "dimension post tag," and "position coordinates."

In the above example, the "dimension addition tag" includes "dimension attribute" and "number information." The "dimension attribute" indicates attribute information of a dimension such as, for example, an important dimension ("*"), a target dimension of a process capability index Cpk ("@"), and a normal dimension (" " [null]). Thus, the dimension attribute (or attribute information) includes importance information ("*") indicating the importance of measurement or management specification information ("@") indicating the measurement target for calculating the process capability index Cpk. Furthermore, the "number information" includes a delimiter ("[," "-," "]"), a sheet number(S), and a dimension number (N). Moreover, the "dimension value" indicates the value of a dimension of the measurement target and the "tolerance" indicates a specified tolerance to be specified for situation in which a general tolerance is not used. In addition, the "dimension post tag" indicates additional information about the dimensions of the measurement target, such as the number of measurement points and a revision history. Moreover, the "position coordinates" indicates the position coordinates (X- and Y-axis coordinates) of the dimensions on the drawing (e.g., on the sheet).

In the data structure illustrated in FIG. 5, the "dimension addition tag," the "dimension value," the "tolerance," and the "dimension post tag" are text data and are displayed on the drawing. Further, in FIG. 5, an "S" and an "N" indicate arbitrary integers, and a number is assigned to "○." Moreover, in the drawing data in certain embodiments, the dimension information of the data structure as illustrated in FIG. 5 is added to the dimensions of the measurement target and a FAI table is generated using the dimension information of the data structure.

Returning again to the description of FIG. 1, the control unit 14, which is a processor including, for example, a central processing unit (CPU) or the like, controls the inspection support device 1 in an integrated manner. The control unit 14 includes, among other components, a drawing acquisition unit 141, an attribute addition processing unit 142, a numbering processing unit 143, a measurement table generation unit 144, a measurement table display processing unit 145, and a measurement table output unit 146.

The drawing acquisition unit 141 is configured to receive drawing data that is in a state in which an attribute addition tag is not yet added, from the outside of the inspection support device 1 and stores it in the drawing storage unit 131. The attribute addition processing unit 142 adds the dimension attribute (attribute information) of the dimension value and the delimiter for identifying the number information of the dimension value to the dimension value of a measurement target included in drawing data.

Note here that the delimiter is, for example, "[," "–," or "]" that separates the characters of a dimension attribute, a sheet number, and a dimension number to increase visibility. The attribute addition processing unit 142 adds a dimension addition tag to a dimension in the specified (or selected) drawing in which the dimension attribute tag does not yet contain number information such as, for example, "@ [–]."

The numbering processing unit 143 adds number information, which includes the drawing sheet number and the dimension number of a measurement target, to the delimiter ("[," "–," "]"). Specifically, the numbering processing unit 143 automatically numbers the dimensions of the measurement target to change the dimension addition tag that does not contain the number information such as "@ [–]" mentioned above to a dimension addition tag that contains number information such as "@ [1-2]."

In addition, the numbering processing unit 143 provides number information to the dimensions of the measurement target by one of the following three processes:

(1) As a first process, the numbering processing unit 143 provides number information in the order of the measurement target dimensions specified by an operation of the input unit 11 such as a mouse click on the drawing displayed on the display unit 12;

(2) As a second process, the numbering processing unit 143 gives the number information in a predetermined order based on the position of the dimension in the drawing displayed on the display unit 12. The term "predetermined order" means an order rule, for example, in which a dimension number is given in the order of moving to the right side and in which a dimension number is given in the order of moving downward, starting from the upper left of the drawing for each sheet of the drawing; and (3) As a third process, the numbering processing unit 143 provides number information in the order in which a delimiter is added to the drawing displayed on the display unit. The numbering processing unit 143 saves (and/or stores) the history information obtained when the dimension with the attribute addition tag is created in, for example, the storage unit 13, and adds the number information on the basis of the history information in the order in which the attribute addition tag is added.

The numbering processing unit 143 is configured to select the order of numbering by an operation of the input unit 11 out of the first process (1) to the third process (3) and perform numbering for the dimension addition tag according to the selected order.

Figure 6:
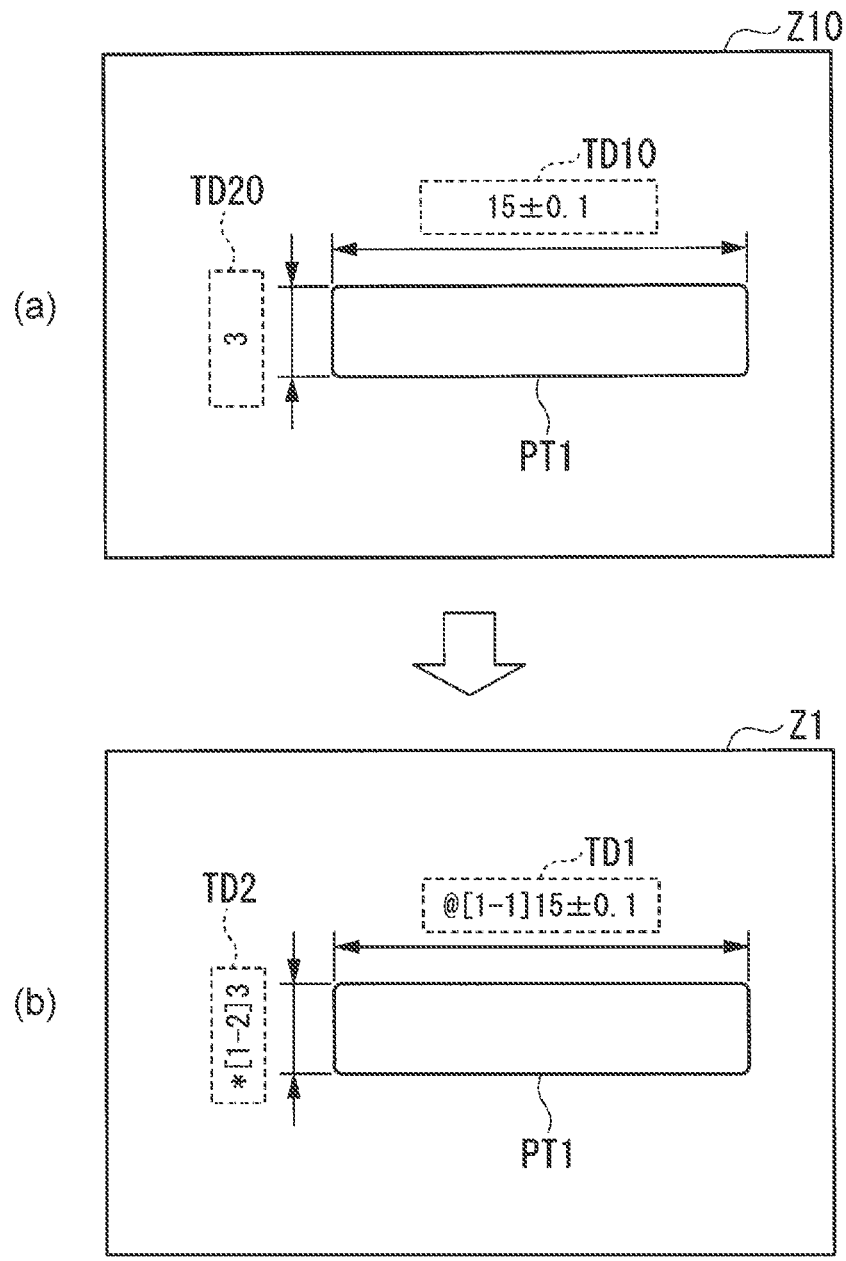
FIG. 6 is a diagram illustrating an example of one embodiment of adding dimension addition tags to dimensions of a measurement target.

FIG. 6 is a diagram illustrating an example of adding dimension addition tags to dimensions of the measurement target according to various embodiments. The drawing Z10 illustrated at (a) in FIG. 6 illustrates a state before the drawing acquisition unit 141 and the numbering processing unit 143 add dimension addition tags. In the drawing Z10, the dimension TD10 is a measurement target dimension of a dimension value "15±0.1" and the dimension TD20 is a measurement target dimension of a dimension value "3."

In addition, the drawing Z1 illustrated at (b) in FIG. 6 illustrates a state after the drawing acquisition unit 141 and the numbering processing unit 143 add the dimension addition tags. In the drawing Z1, the drawing acquisition unit 141 adds the dimension addition tag "@ [–]" to the dimension TD10 in the drawing Z10, and the numbering processing unit 143 numbers and adds "[1-1]" (the sheet number "1" and the dimension number "1") by the numbering process, by which the dimension TD1 is changed to "@ [1-1] 15±0.1."

In addition, the drawing acquisition unit 141 adds a dimension addition tag "*[–]" to the dimension TD20 in the drawing Z10, and the numbering processing unit 143 numbers and adds "[1-2]" (the sheet number "1" and the dimension number "2") by the numbering process, by which the dimension TD2 is changed to "@ [1-2] 3." Moreover, the numbering processing unit 143, in certain embodiments, includes a function of shifting a numbered dimension number in case a new dimension number is added after the dimension number is numbered. For example, if the dimension number is greater than or equal to the specified dimension number, the numbering processing unit 143 performs a shift process of shifting the dimension number by changing the dimension number to a value obtained by adding the specified number of shifts to the dimension number.

Returning to the description of FIG. 1, the measurement table generation unit 144 generates a FAI table on the basis of the dimension addition tag (e.g., dimension addition information) in which the dimension attribute is associated with the number information added to the delimiter and based on the dimension values of the measurement target. Note here that the FAI table includes target identification information (such as a dimension addition tag) and inspection standards, indicating the measurement target corresponding to the drawing data, as illustrated in FIG. 4 and described elsewhere herein. The target identification information includes the "dimension addition tag," the "dimension attribute," that "sheet number," and the "dimension number," as shown in FIG. 4.

In addition, in generating the FAI table, the measurement table generation unit 144 uses delimiters to separately output the "dimension addition tag," the "dimension attribute," the "sheet number," and the "dimension number," illustrated in FIG. 4. As a result, this information is separated into columns and a measurement table display processing unit 145, which is described elsewhere herein, makes it easy to highlight, mark up, and filter various attributes (e.g., specific attributes).

At least some inspection standards include the dimension value of the measurement target and the tolerance of the dimension value. In situations in which a tolerance is added to the dimension value of the measurement target in the drawing data, the measurement table generation unit 144 generates a FAI table using the added tolerance (e.g., a specified tolerance). Furthermore, in situations in which a tolerance is not added to the dimension value of the measurement target in the drawing data, the measurement table generation unit 144 receives the tolerance corresponding to the dimension value of the measurement target from the tolerance storage unit 132 and generates a FAI table using the received tolerance. Furthermore, the measurement table generation unit 144 stores the generated FAI table in the measurement table storage unit 133.

The measurement table display processing unit 145 (an example of the display processing unit) is configured to display a drawing indicated by the drawing data stored in the drawing storage unit 131 and the FAI table generated by the measurement table generation unit 144 on the display unit 12 so that the drawing can be compared with the FAI table. Moreover, the measurement table display processing unit 145 visibly displays the positions of the target identification information (e.g., the dimension addition tag) and the inspection standards in the FAI table that correspond to the dimension of the measurement target, which was specified by an operation of the input unit 11 such as, for example, a mouse in the drawing. Specifically, the measurement table display processing unit 145 scrolls to the position of the row of the FAI table corresponding to the dimension of the measurement target specified in the drawing and can perform markups, such as, for example, changing the display color of a part or all of the row, among other functions that are possible and contemplated herein.

Furthermore, the measurement table display processing unit 145 visibly displays the position of the dimension of the measurement target in the drawing corresponding to the dimension addition tag and the inspection standards specified by the operation of the input unit 11 such as, for example, a mouse in the FAI table. Specifically, the measurement table display processing unit 145 can scroll to the position of the drawing corresponding to the dimension of the measurement target specified in the FAI table and perform markups, such as, for example, changing the display color of the dimension of the position of the drawing, among other functions that are possible and contemplated herein.

The measurement table output unit 146 is configured to output the FAI table generated by the measurement table generation unit 144 and the drawing data corresponding to the FAI table to the outside of the inspection support device 1. Specifically, the measurement table output unit 146 outputs the drawing data (e.g., a PDF file) stored in the drawing storage unit 131 to the outside and can also output a FAI table (e.g., an Excel file) corresponding to the drawing data and stored in the measurement table storage unit 133 to the outside.

The inspection management device 2 includes, among other components, an input unit 21, a display unit 22, a storage unit 23, and a control unit 24. The input unit 21 includes an input device, such as, for example a keyboard or a mouse, among other input devices that are possible and contemplated herein. The input unit 21 accepts an operation of a user such as a supplier S1 and accepts inputs of various information.

The display unit 22, which includes, for example, a display device, such as a liquid crystal display (LCD), displays various information such as, for example, drawings and FAI, among other information that is possible and contemplated herein.

The storage unit 23 is configured to store various information used by the inspection management device 2. In some embodiments, the storage unit 23 includes, for example, a drawing storage unit 231 and a measurement table storage unit 232.

The drawing storage unit 231 can store drawing data such as the drawing Z1 illustrated in FIG. 2 similar to the drawing storage unit 131 described elsewhere herein. The measurement table storage unit 232 stores a FAI table generated by the inspection support device 1, as illustrated in FIG. 4. The measurement table storage unit 232 stores a FAI table to which a measured value is added by the input processing unit 243, which is described elsewhere herein.

The control unit 24 includes a processor including a CPU, for example, and is configured to control the inspection management device 2 in an integrated manner. The control unit 24 includes, among other components, a drawing acquisition unit 241, a measurement table acquisition unit 242, an input processing unit 243, a result determination unit 244, a measurement table display processing unit 245, and a measurement table output unit 246.

The drawing acquisition unit 241 is configured to receive the drawing data with the attribute addition tag that is output by the inspection support device 1 and store the drawing data in the drawing storage unit 231. The measurement table acquisition unit 242 is configured to receive a FAI table in which a measured value is not yet entered and that is output by the inspection support device 1 and store the FAI table in the measurement table storage unit 232.

The input processing unit 243 is configured to add the measured value of the dimension of the measurement target, which has been input from the input unit 21 by a user such as the supplier S1, to the FAI table stored by the measurement table acquisition unit 242. The result determination unit 244 (an example of the determination processing unit) is configured to determine the inspection result of the dimension of the measurement target based on the inspection standards of the FAI table with the measured value added by the input processing unit 243 and based on the measured value. The result determination unit 244 determines, for example, the inspection result based on whether or not the measured value is a value between the upper limit dimension value and the lower limit dimension value of the FAI table.

The result determination unit 244 is configured to perform markups, such as, for example, changing the color of the measured value in the FAI table for situations in which the measured value is not between the upper limit dimension value and the lower limit dimension value in the FAI table. The result determination unit 244 may then update the FAI table by adding the inspection results to the FAI table stored in the measurement table storage unit 232.

The measurement table display processing unit 245 (an example of the display processing unit) is configured to display the drawing indicated by the drawing data stored in the drawing storage unit 231 and the FAI table stored in the measurement table storage unit 232 on the display unit 22 so that the drawing can be compared with the FAI table. Note that the measurement table display processing unit 245 performs the markup(s), such as, for example, changing the display color for a measured value that deviates from the range between the upper limit dimension value and the lower limit dimension value in the FAI table.

In addition, the measurement table display processing unit 245 includes a function for linking a drawing with the FAI table similar to the measurement table display processing unit 145 described elsewhere herein. Specifically, the measurement table display processing unit 245 visibly displays the positions of the target identification information (e.g., a dimension addition tag) and the inspection standards in the FAI table corresponding to the dimension of the measurement target specified by an operation of the input unit 21 such as, for example, a mouse in the drawing. That is, the measurement table display processing unit 245 can scroll to the position of the row in the FAI table that corresponds to the dimension of the measurement target specified in the drawing and performs the markup(s), such as changing the display color of a part or all of the row.

In addition, the measurement table display processing unit 245 visibly displays the position of the dimension of the measurement target in the drawing corresponding to the dimension addition tag and the inspection standards specified by an operation of the input unit 21 such as, for example, a mouse in the FAI table. Specifically, the measurement table display processing unit 245 can scroll to the position in the drawing corresponding to the dimension of the measurement target specified in the FAI table and performs the markup(s), such as changing the display color of the dimension in the position of the drawing.

The measurement table output unit 246 is configured to output the FAI table with the measured value added by the input processing unit 243 and with the inspection result added by the result determination unit 244 and the drawing data corresponding to the FAI table to the outside of the inspection management device 2. Specifically, the measurement table output unit 246 can output the drawing data (e.g., a PDF file) stored in the drawing storage unit 231 to the outside and outputs a FAI table (e.g., an Excel® file) corresponding to the drawing data and stored in the measurement table storage unit 232 to the outside.

Figure 7:
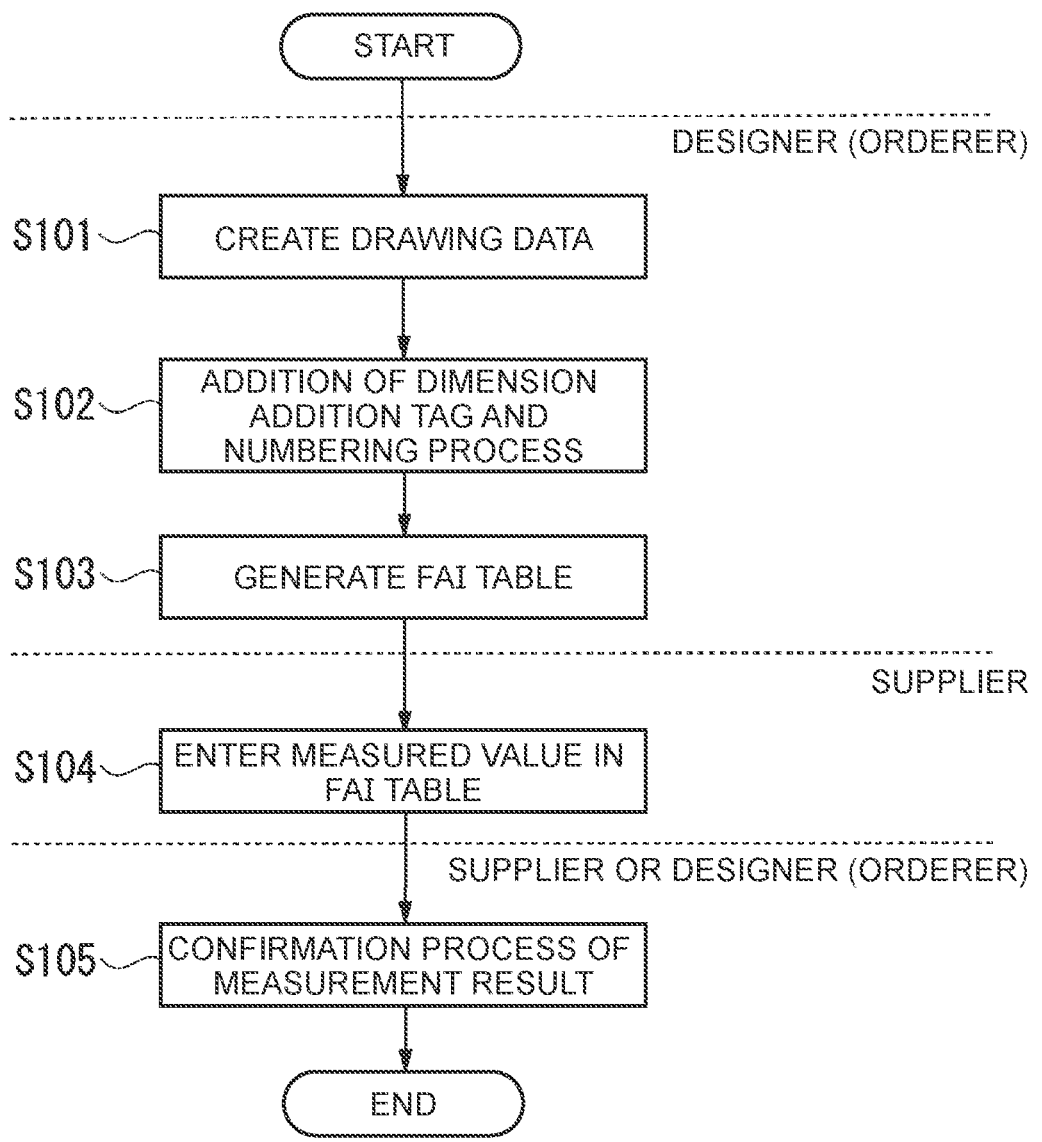
FIG. 7 is a flowchart illustrating an example of one embodiment of behavior of the inspection support system of FIG. 1.

Below, the behavior of the inspection support system 100 according to various embodiments is described with further reference to the drawings. FIG. 7 is a flowchart illustrating an example of the behavior of the inspection support system 100 according to various embodiments.

As illustrated in FIG. 7, in the inspection support system 100, first, a drawing creation device such as a CAD device (not illustrated) first creates drawing data by an operation of a designer D1 (block S101). The drawing creation device may be an arbitrary CAD device or may be an inspection support device 1 including a set of CAD functions.

Subsequently, the inspection support device 1 performs the addition of a dimension addition tag and a numbering process (block S102). The details of the addition of the dimension addition tag and the numbering process are described herein with reference to FIGS. 8 through 12.

The inspection support device 1 next generates a FAI table (block S103). The inspection support device 1 generates the FAI table from the drawing data obtained by adding the dimension addition tag and performing the numbering process. The details of the FAI table generation process are described later with reference to FIG. 13.

Subsequently, the inspection management device 2 enters a measured value in the FAI table (block S104). The input processing unit 243 of the inspection management device 2 adds, for example, the measured value of the dimension of the measurement target measured by the supplier S1 to the FAI table generated by the inspection support device 1.

Next, the inspection management device 2 (or the inspection support device 1) performs a confirmation process of the measurement result (block S105). The result determination unit 244 of the inspection management device 2 determines the inspection result of the dimension of the measurement target by comparing the measured value with the inspection standards in the FAI table and adds the inspection result to the FAI table. In addition, the measurement table display processing unit 245 of the inspection management device 2 (or the measurement table display processing unit 145 of the inspection support device 1) displays the drawing and the FAI table on the display unit 22 (or the display unit 12) to confirm the measurement result. The details of the confirmation process of the measurement result are described later with reference to FIGS. 14 and 15. After the process of block S105, the inspection support system 100 ends the process.

In the process illustrated in FIG. 7, the processes from blocks S101 through S103 may be performed by a designer D1 (e.g., an ordering entity) and the process of block S104 may be performed by a supplier S1 (e.g., a supplying entity). In addition, the process of block S105 may be performed by both the designer D1 and/or the supplier S1.

Figure 8:
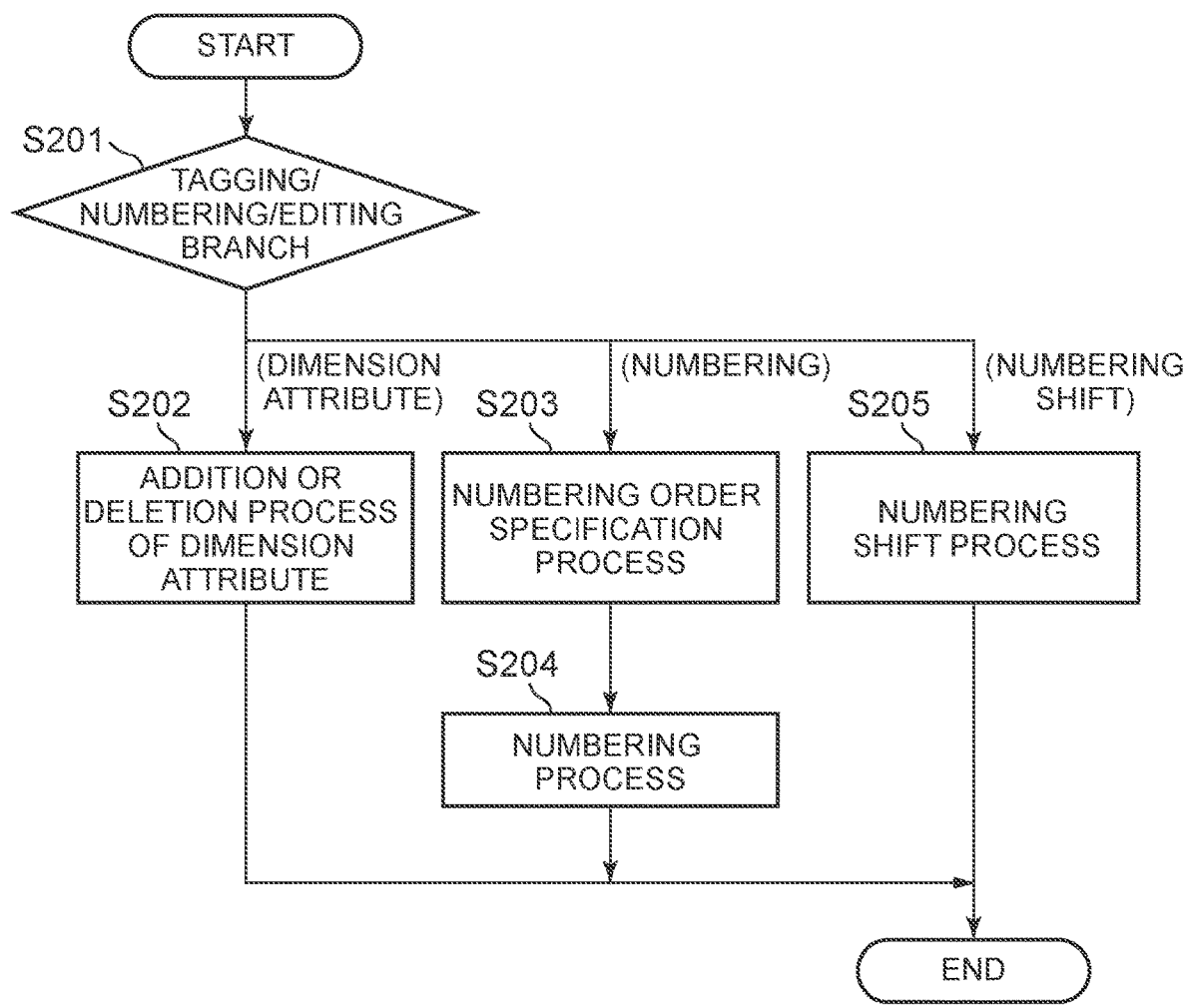
FIG. 8 is a flowchart illustrating an example of one embodiment of a process for editing dimensions on a drawing.

Next, the details of the process of block S102 in FIG. 7 is described with reference to FIG. 8. FIG. 8 is a flowchart illustrating an example of one embodiment of a process for editing dimensions on a drawing. As illustrated in FIG. 8, the control unit 14 of the inspection support device 1 performs a tagging/numbering/editing branch according to an operation of the input unit 11 (block S201). If the dimension attribute process is specified (block S201: dimension attribute), the control unit 14 proceeds to block S202, in which the attribute addition processing unit 142 of the control unit 14 performs the addition or deletion process of a dimension attribute. The details of the process of block S202 is described later with reference to FIG. 9. The control unit 14 ends the dimension editing process after the process of block S202.

In addition, if the numbering process is specified (block S201: numbering), the control unit 14 proceeds to block S203, in which the numbering processing unit 143 of the control unit 14 performs a numbering order specification process (process of block S203) and a numbering process (process of block S204). The details of the process of block S203 will be described later with reference to FIG. 10, and the details of the process of block S204 will be described later with reference to FIG. 11. The control unit 14 ends the dimension editing process after the process of block S204.

Furthermore, if the numbering shift process is specified (block S201: numbering shift), the control unit 14 proceeds to block S205, in which the numbering processing unit 143 of the control unit 14 performs the numbering shift process. The details of the process of block S205 is described later with reference to FIG. 12. The control unit 14 ends the dimension editing process after the process of block S205.

Figure 9:
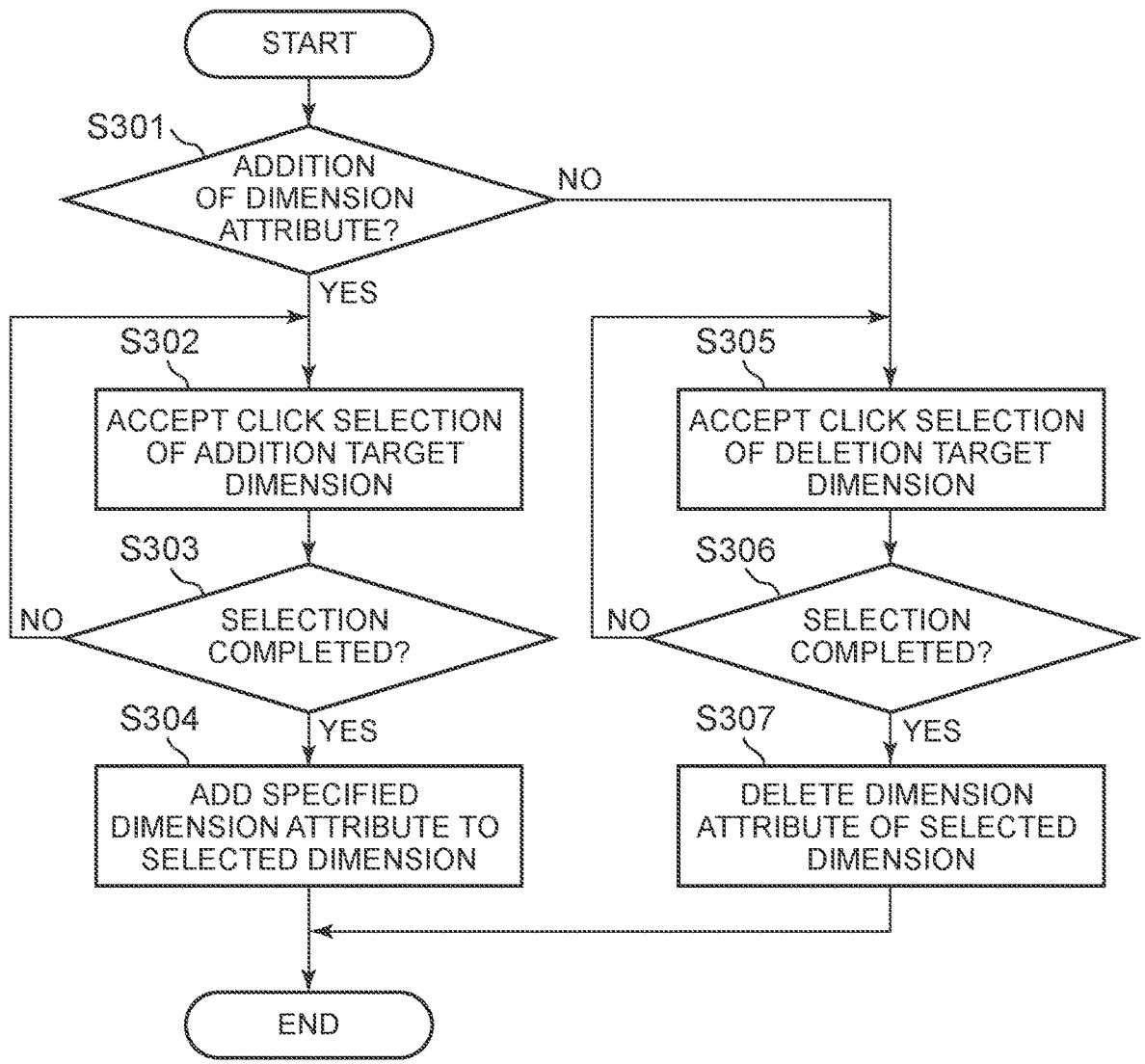
FIG. 9 is a flowchart illustrating one example of various embodiments of an addition process and/or a deletion process of a dimension attribute.

The following describes the details of the addition or deletion process of a dimension attribute in block S202 in FIG. 8 described above, with reference to FIG. 9. FIG. 9 is a flowchart illustrating an example of an addition process and a deletion process of a dimension attribute according to various embodiments.

In FIG. 9, the attribute addition processing unit 142 first determines whether or not the dimension attribute is added (block S301). If determining that the process is a dimension attribute process for adding a dimension attribute by an operation of the input unit 11 such as a mouse (block S301: YES), the attribute addition processing unit 142 proceeds to block S302. In addition, if determining that the process is not a dimension attribute process for adding a dimension attribute by an operation of the input unit 11 such as a mouse (block S301: NO), the attribute addition processing unit 142 proceeds to block S305.

In block S302, the attribute addition processing unit 142 accepts a click selection of an addition target dimension by an operation of the input unit 11 such as a mouse. Next, the attribute addition processing unit 142 can determine whether or not the selection of the addition target dimension is completed (block S303). The attribute addition processing unit 142 proceeds to block S304 in response to the selection of the addition target dimension being completed (block S303: YES). In addition, the attribute addition processing unit 142 returns to block S302 unless the selection of the addition target dimension is completed (block S303: NO).

In block S304, the attribute addition processing unit 142 adds the specified dimension attribute to the selected dimension. Specifically, the attribute addition processing unit 142 specifies one of the dimension attribute(s), the important dimension ("*"), the target dimension ("@") of the process capability index Cpk, and the normal dimension (" " [null]) and adds it to the selected dimension. After the process of block S304, the attribute addition processing unit 142 can end the addition or deletion process of the dimension attribute.

In addition, in block S305, the attribute addition processing unit 142 accepts a click selection of a deletion target dimension by an operation of the input unit 11 such as a mouse. Subsequently, the attribute addition processing unit 142 determines whether or not the selection of the deletion target dimension is completed (block S306). The attribute addition processing unit 142 proceeds to block S307 if the selection of the deletion target dimension is completed (block S306: YES). Moreover, the attribute addition processing unit 142 returns to block S305 unless the selection of the deletion target dimension is completed (block S306: NO).

In block S307, the attribute addition processing unit 142 deletes the dimension attribute of the selected dimension. After the process of block S307, the attribute addition processing unit 142 ends the addition or deletion process of the dimension attribute.

Figure 10:
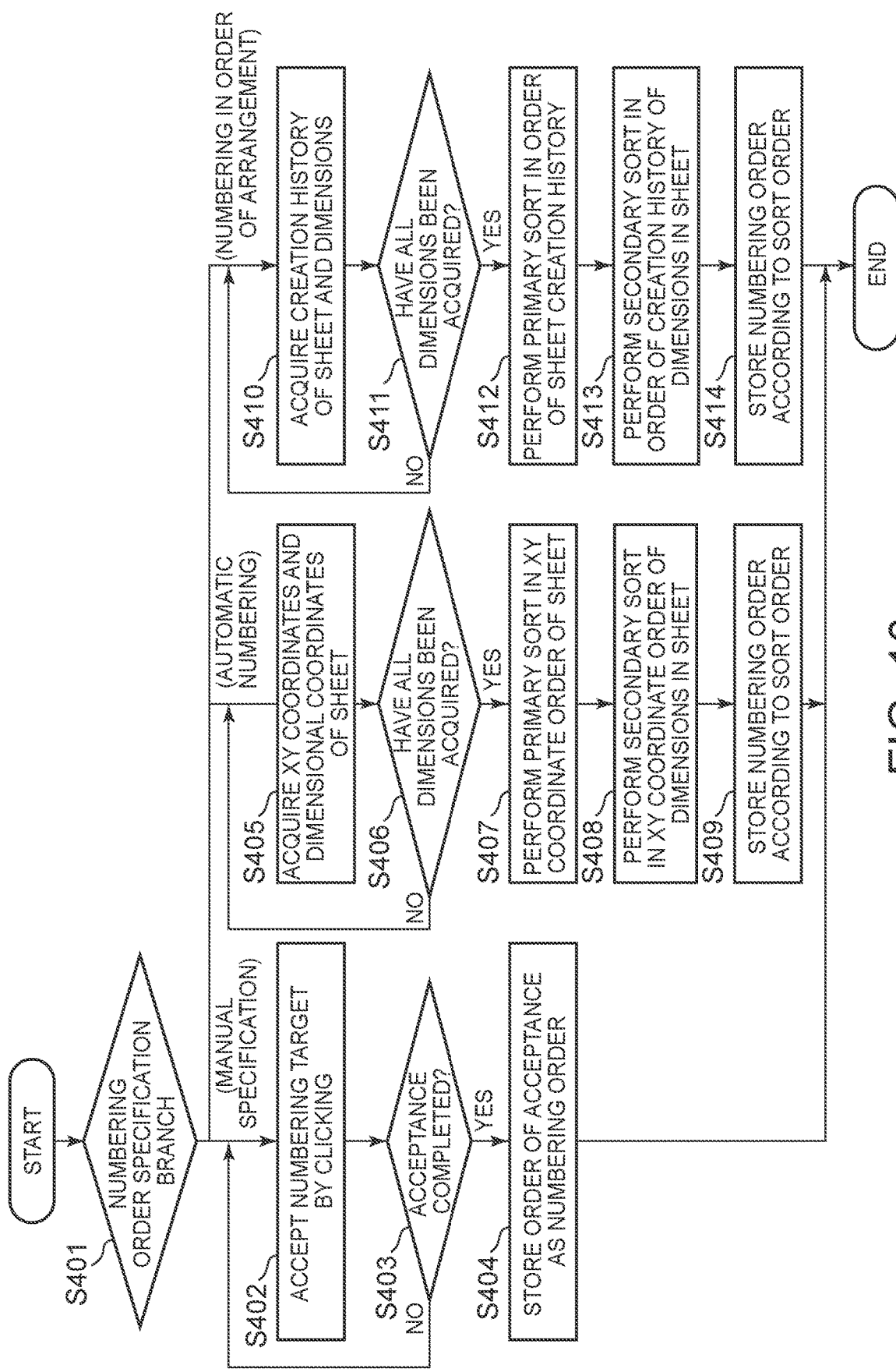
FIG. 10 is a flowchart illustrating an example of one embodiment of a numbering order specification process.

The following describes the details of the numbering order specification process in block S203 of FIG. 8 described above with reference to FIG. 10. FIG. 10 is a flowchart illustrating an example of a numbering order specification process according to various embodiments.

In FIG. 10, the numbering processing unit 143 first performs the numbering order specification branch by an operation of the input unit 11, such as a mouse (block S401). In response to the specification being manually performed (block S401: manual specification), the numbering processing unit 143 proceeds to block S402. In response to the numbering being automatically performed (block S401: automatic numbering), the numbering processing unit 143 proceeds to block S405. Furthermore, the numbering processing unit 143 proceeds to block S410 in response to the numbering in the order of arrangement being specified (block S401: numbering in the order of arrangement).

In block S402, the numbering processing unit 143 accepts the numbering target, for example, by the click of a mouse. Specifically, the numbering processing unit 143 accepts the numbering target dimension specified by a user (e.g., a designer D1).

Subsequently, the numbering processing unit 143 determines whether or not the numbering target acceptance is completed (block S403). The numbering processing unit 143 proceeds to block S404 in response to the numbering target acceptance being completed (block S403: YES). Furthermore, the numbering processing unit 143 returns to block S402 unless the numbering target acceptance is completed (block S403: NO) and then accepts a numbering target.

In block S404, the numbering processing unit 143 stores the order of acceptance of numbering targets as the numbering order. Specifically, the numbering processing unit 143 stores the order of acceptance of numbering targets, as the numbering order, in the storage unit 13. After the process of block S404, the numbering processing unit 143 ends the numbering order specification process.

In addition, in block S405, the numbering processing unit 143 acquires the XY coordinates and dimensional coordinates of the sheet. In other words, the numbering processing unit 143 acquires the position information of the dimensions of the measurement target on the drawing.

Subsequently, the numbering processing unit 143 determines whether or not all the dimensions have been acquired (block S406). The numbering processing unit 143 proceeds to block S407 in response to determining that all dimensions are acquired (block S406: YES). Unless all dimensions are acquired (block S406: NO), the numbering processing unit 143 returns to block S405 and repeats the process until the position information of all of the dimensions have been acquired.

In block S407, the numbering processing unit 143 performs a primary sort in the XY coordinate order of the sheet. The numbering processing unit 143 sorts, for example, the sheet numbers in the rightward order and in the downward order with the upper left as the reference in the entire drawing data.

Subsequently, the numbering processing unit 143 performs a secondary sort in the XY coordinate order of the dimensions in the sheet (block S408). The numbering processing unit 143 sorts, for example, the dimension numbers in the rightward order and in the downward order with the upper left as the reference in the same sheet.

Next, the numbering processing unit 143 stores the numbering order according to the sort order (block S409). In other words, the numbering processing unit 143 stores the sort order as the numbering order in the storage unit 13. After the process of block S409, the numbering processing unit 143 ends the numbering order specification process.

In addition, in block S410, the numbering processing unit 143 acquires the creation history of the sheet and dimensions. In other words, the numbering processing unit 143 acquires the arrangement order of the dimensions of the measurement target on the drawing.

Subsequently, the numbering processing unit 143 determines whether or not all the dimensions have been acquired (block S411). In response to all of the dimensions having been acquired (block S411: YES), the numbering processing unit 143 proceeds to block S412. Unless all the dimensions have been acquired (block S411: NO), the numbering processing unit 143 returns to block S410 and repeats the process until the creation history of all of the dimensions have been acquired.

In block S412, the numbering processing unit 143 performs a primary sort in the order of sheet creation history. Subsequently, the numbering processing unit 143 performs a secondary sort in the order of the creation history of the dimensions in each sheet (block S413). The numbering processing unit 143 sorts the dimension numbers in the order of creation history in the same sheet, for example.

Next, the numbering processing unit 143 stores the numbering order according to the sort order (block S414). In other words, the numbering processing unit 143 stores the sort order as the numbering order in the storage unit 13. After the process of block S414, the numbering processing unit 143 ends the numbering order specification process.

Figure 11:
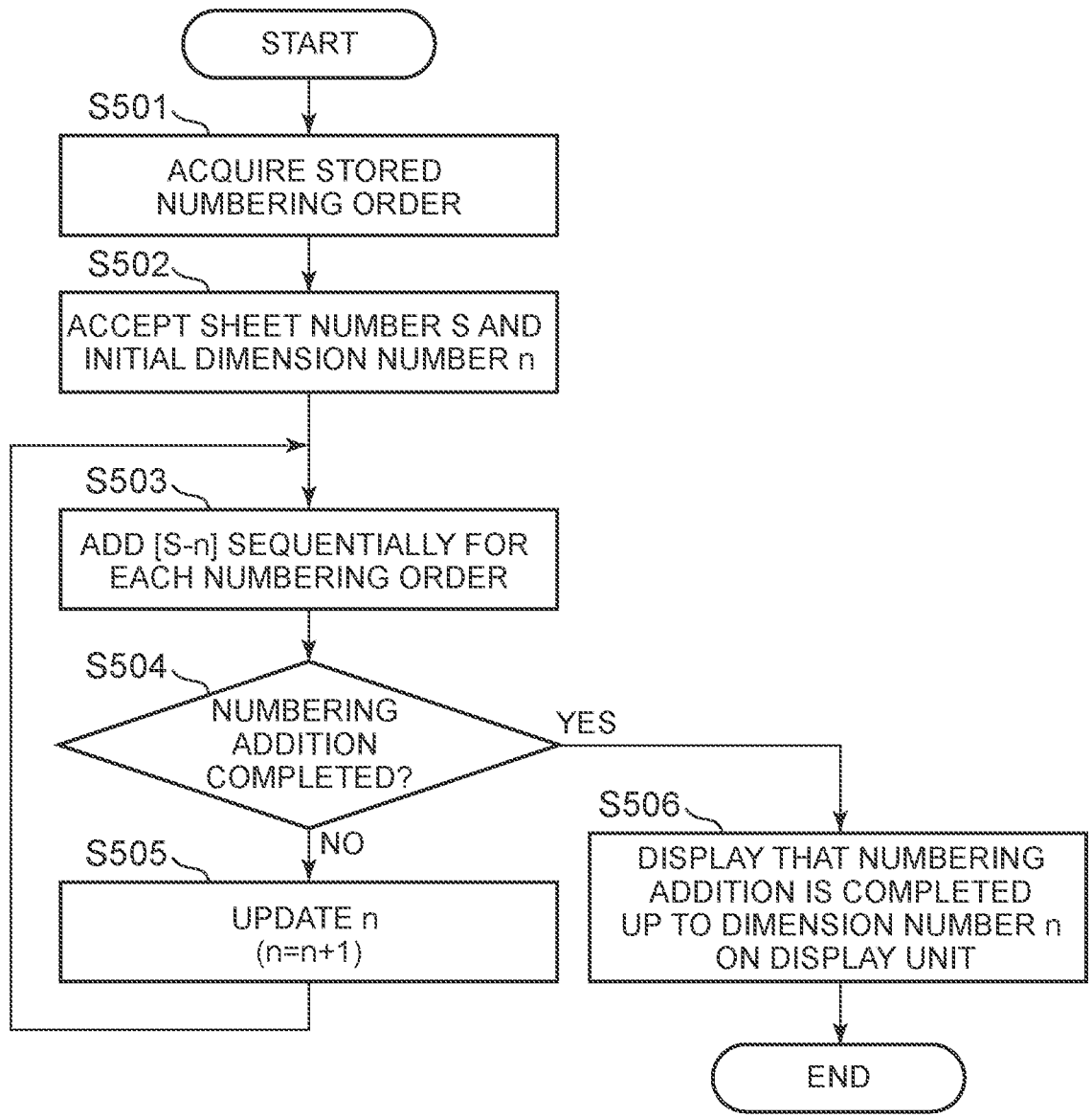
FIG. 11 is a flowchart illustrating an example of one embodiment of a numbering process of number information.

The following describes the details of the numbering process of block S204 in FIG. 8 described above with reference to FIG. 11. FIG. 11 is a flowchart illustrating an example of the numbering process of number information according to various embodiments.

In FIG. 11, the numbering processing unit 143 first acquires the stored numbering order (block S501). The numbering processing unit 143 acquires the numbering order stored in the storage unit 13 by the numbering order specification process illustrated in FIG. 10 described elsewhere herein.

Subsequently, the numbering processing unit 143 accepts the sheet number S and the initial dimension number n by an operation of the input unit 11 (block S502). Thereafter, the numbering processing unit 143 adds [S-n] to the dimensions sequentially for each numbering order (block S503).

The numbering processing unit 143 then determines whether or not the numbering addition is completed (block S504). The numbering processing unit 143 proceeds to block S506 in response to the numbering addition being completed (block S504: YES). Unless the numbering addition is completed (block S504: NO), the numbering processing unit 143 proceeds to block S505.

In block S505, the numbering processing unit 143 updates the above "n" (n=n+1). After the process of block S505, the numbering processing unit 143 returns to block S503 and repeats the process until the numbering addition is completed.

In addition, in block S506, the numbering processing unit 143 displays that the numbering addition is completed up to the dimension number n on the display unit 12. The numbering processing unit 143 may automatically confirm whether there are duplicates in dimension number n. After the process of block S506, the numbering processing unit 143 ends the numbering process for number information.

Figure 12:
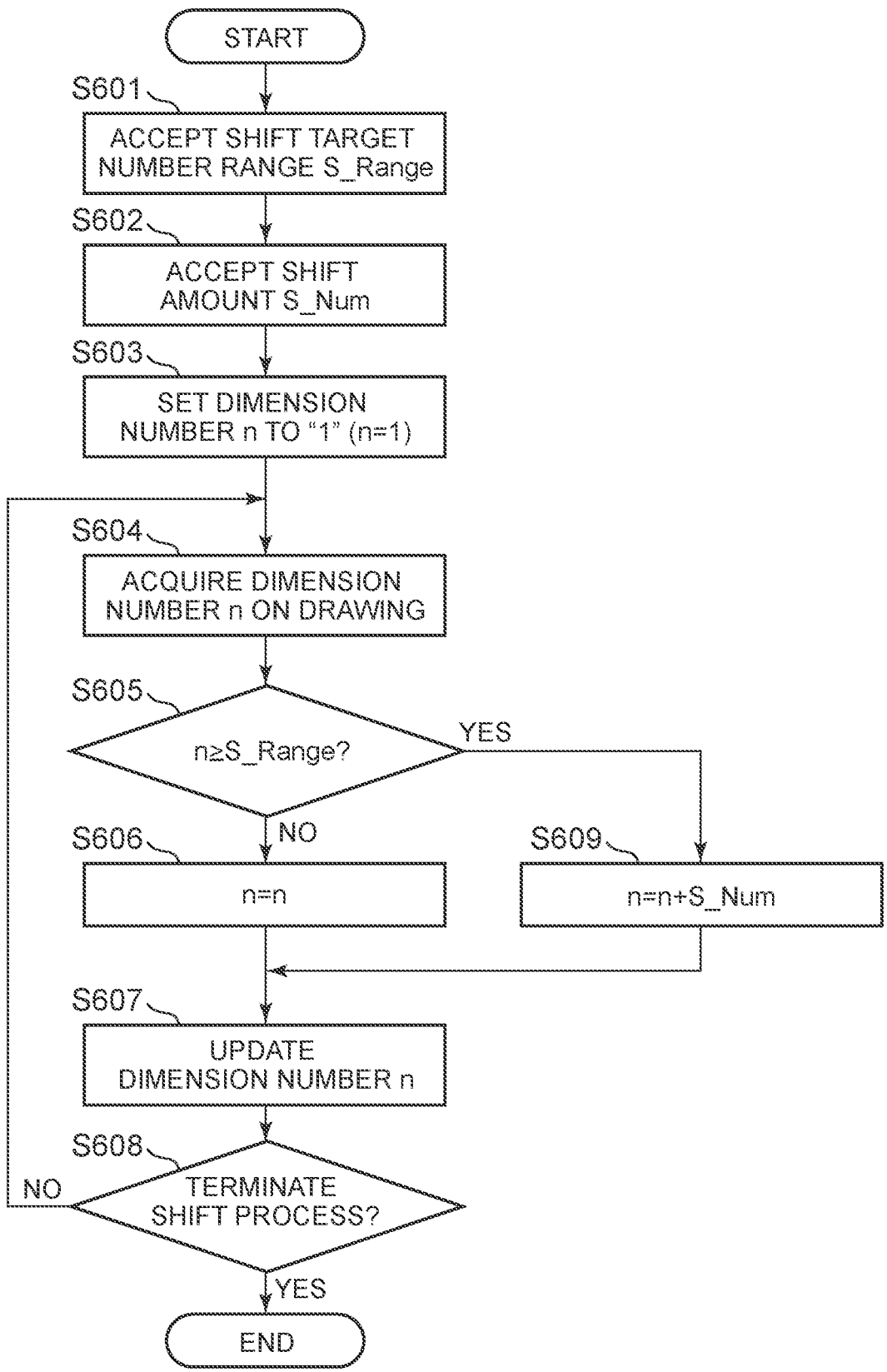
FIG. 12 is a flowchart illustrating an example of one embodiment of a numbering shift process.

The following describes the details of the numbering shift process in block S205 of FIG. 8 described above with reference to FIG. 12. FIG. 12 is a flowchart illustrating an example of a numbering shift process according to various embodiments.

In FIG. 12, the numbering processing unit 143 accepts the shift target number range S_Range by an operation of the input unit 11 (block S601). The numbering processing unit 143 then accepts the shift amount S_Num (e.g., the number of shifts) by an operation of the input unit 11 (block S602).

Subsequently, the numbering processing unit 143 sets the dimension number n to "1" (n=0, block S603). In response thereto, the numbering processing unit 143 acquires the dimension number n on the drawing (block S603).

Next, the numbering processing unit 143 determines whether the dimension number n is greater than or equal to the shift target number range S_Range (block S605). In response to the dimension number n being greater than or equal to the shift target number range S_Range (n_S_Range) (block S605: YES), the numbering processing unit 143 proceeds to block S609. In response to the dimension number n being less than the shift target number range S_Range (n<S_Range) (block S605: NO), the numbering processing unit 143 proceeds to block S606.

Since the dimension number n is outside the shift target number range in block S606, the numbering processing unit 143 leaves the dimension number n as it is (n=n) and does not shift the dimension number. Next, the numbering processing unit 143 updates the dimension number n (block S607). Specifically, the numbering processing unit 143 updates the dimension number n by adding "1" to the dimension number n (n=n+1).

Thereafter, the numbering processing unit 143 determines whether to terminate the shift process (block S608). The numbering processing unit 143 terminates the numbering shift process in response to terminating the shift process (block S608: YES). Unless terminating the shift process (block S608: NO), the numbering processing unit 143 returns to block S604.

In addition, because the dimension number n is within the shift target number range in block S609, the numbering processing unit 143 adds the shift amount S_Num to the dimension number n (n=n+S_Num) to shift the dimension number. After the process of block S606, the numbering processing unit 143 proceeds to block S607.

According to the process illustrated in FIG. 12 described above, for example, in the case where the shift target number range S_Range is "3," the shift amount S_Num is "2," and the number information before the shift process is [5-1], [5-2], [5-3], [5-4], and after, the numbering processing unit 143 shifts the dimension numbers equal to or greater than "3" by "2." As a result, the number information after the shift process is [5-1], [5-2], [5-5], [5-6], and after.

Figure 13:
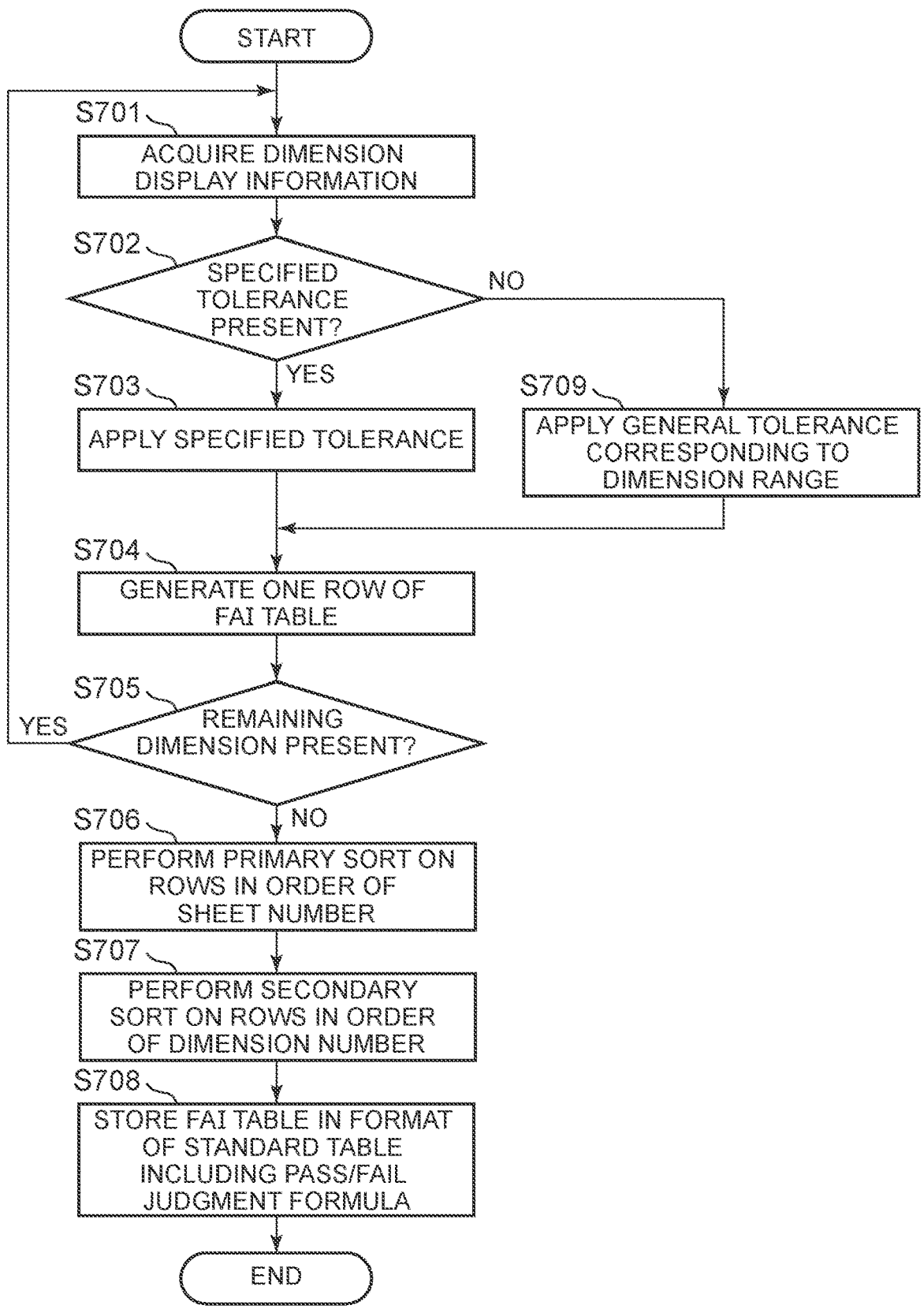
FIG. 13 is a flowchart illustrating an example of one embodiment of a first article inspection (FAI) table generation process.

The following describes the details of a FAI table generation process in block S103 of FIG. 7 described above with reference to FIG. 13. FIG. 13 is a flowchart illustrating an example of a FAI table generation process according to various embodiments.

In FIG. 13, the measurement table generation unit 144 acquires the dimension display information (block S701). The measurement table generation unit 144 acquires the dimension display information with the dimension addition tag described on the drawing.

Subsequently, the measurement table generation unit 144 determines whether or not a specified tolerance is present (block S702). In other words, the measurement table generation unit 144 determines whether or not the dimension display information includes a specified tolerance. If the specified tolerance is present (block S702: YES), the measurement table generation unit 144 proceeds to block S703. Unless the specified tolerance is present (block S702: NO), the measurement table generation unit 144 proceeds to block S709.

In block S703, the measurement table generation unit 144 applies the specified tolerance. In other words, the measurement table generation unit 144 uses the specified tolerance included in the dimension display information as a tolerance when generating a FAI table.

Subsequently, the measurement table generation unit 144 generates one row of the FAI table (block S704). Specifically, the measurement table generation unit 144 generates one row of the FAI table, as illustrated in FIG. 4, based on the dimension values of the measurement target included in the dimension display information and tolerances therefor. If the presence of multiple dimensions, such as "(5×)," is specified in the dimension post tag, the measurement table generation unit 144 may perform a process of increasing the number of rows according to the number. For example, if "(2×)" is given to the dimension post tag, the measurement table generation unit 144 generates two rows of the FAI table.

Then, the measurement table generation unit 144 determines whether there are any remaining dimensions (block S705). Specifically, the measurement table generation unit 144 determines whether or not there is a measurement target dimension that is not yet reflected in the FAI table. In response to any dimension remaining (block S705: YES), the measurement table generation unit 144 returns to block S701. Unless any dimension remains (block S705: NO), the measurement table generation unit 144 proceeds to block S706.

In block S706, the measurement table generation unit 144 performs a primary sort on the FAI rows in the order of the sheet number. In other words, the measurement table generation unit 144 sorts the respective FAI rows in the order of the sheet number.

Subsequently, the measurement table generation unit 144 performs a secondary sort on the FAI rows in the order of the dimension number. In other words, the measurement table generation unit 144 sorts the respective FAI rows in the order of the dimension number.

Next, the measurement table generation unit 144 stores the FAI table in the format of the standard table including a pass/fail judgment formula (block S708). In other words, the measurement table generation unit 144 stores a FAI table file including the pass/fail judgment formula in the measurement table storage unit 133. After the process of block S708, the measurement table generation unit 144 ends the FAI table generation process. In addition, in FIG. 13 described above, the measurement table generation unit 144 may further sort (e.g., rearrange) the rows of the FAI table for each dimension attribute.

Figure 14:
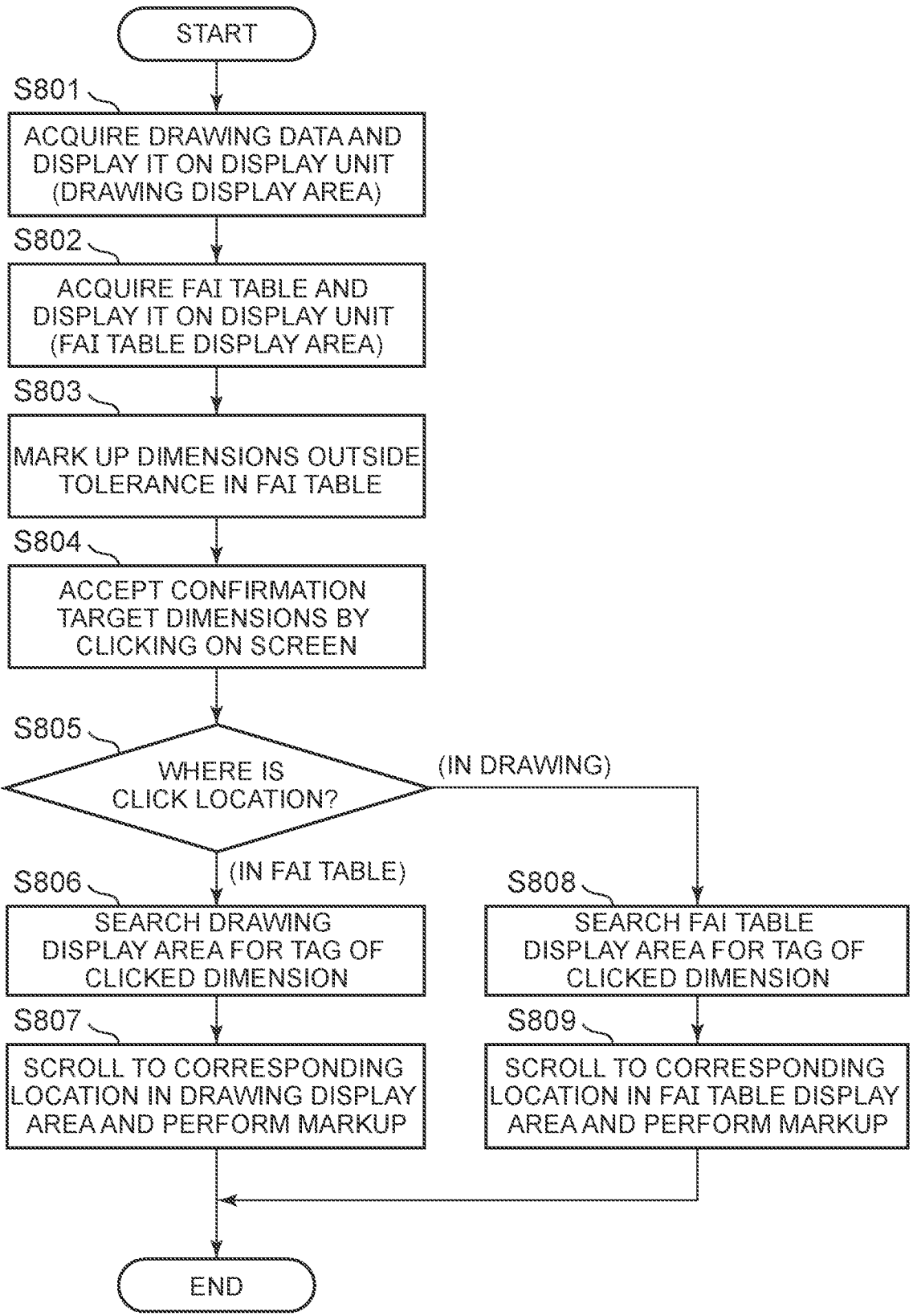
FIG. 14 is a flowchart illustrating an example of one embodiment of a FAI table confirmation process.
Figure 15:
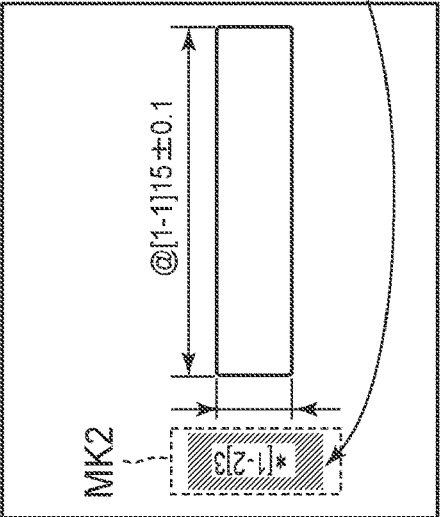
FIG. 15 is a diagram illustrating a display example of one embodiment of a drawing and one embodiment of a FAI table confirmation display process.

The following describes the details of the confirmation process of the measurement result of block S105 in FIG. 7 described above with reference to FIGS. 14 and 15. FIG. 14 is a flowchart illustrating an example of a FAI table confirmation process according to various embodiments and FIG. 15 is a diagram illustrating a display example of a drawing and FAI table confirmation display process according to various embodiments. The screen G1 illustrated in FIG. 15 represents an example of a display screen displayed by the measurement table display processing unit 245.

In FIG. 14, the measurement table display processing unit 245 of the inspection management device 2 acquires drawing data and displays the drawing data on the display unit 22 (e.g., in the drawing display area SG1 in FIG. 15) (block S801). In other words, the measurement table display processing unit 245 acquires drawing data from the drawing storage unit 231 and displays the drawing data in the drawing display area SG1 of the display unit 22.

Subsequently, the measurement table display processing unit 245 acquires a FAI table and displays the FAI table on the display unit 22 (e.g., in the FAI table display area SG2 in FIG. 15) (block S802). In other words, the measurement table display processing unit 245 acquires a FAI table (here, a FAI table with the measured values entered) from the measurement table storage unit 232 and displays the FAI table in the FAI table display area SG2 of the display unit 22.

Next, the measurement table display processing unit 245 marks up the dimensions outside the tolerance in the FAI table (block S803). In other words, the measurement table display processing unit 245 performs a set of markups such as changing the display color of the dimensions outside the tolerance determined by the result determination unit 244, as shown in the mark MK1 in FIG. 15.

The measurement table display processing unit 245 then can accept a confirmation target dimension by clicking on the screen by an operation of the input unit 21 (block S804). Note that the confirmation target dimension includes a dimension in the drawing of the drawing display area SG1 and a dimension in the FAI table of the FAI table display area SG2.

Subsequently, the measurement table display processing unit 245 branches the process according to the click location (block S805). In response to the click location being in the FAI table (block S805: in the FAI table), the measurement table display processing unit 245 proceeds to block S806. In response to the click location being in the drawing (block S805: in the drawing), the measurement table display processing unit 245 proceeds to block S808.

In block S806, the measurement table display processing unit 245 searches the drawing display area SG1 for the dimension addition tag of the clicked dimension. Subsequently, the measurement table display processing unit 245 scrolls to the corresponding location in the drawing display area SG1 and performs markup (block S807). For example, in situations in which the row of the dimension addition tag of, "*[1-2]," in the FAI table display area SG2 is clicked and selected in FIG. 15, the measurement table display processing unit 245 performs one or more markups such as changing the display color, as in the dimension of the mark MK2 in the drawing display area SG1.

After the process of block S807, the measurement table display processing unit 245 ends the process. Furthermore, in block S808, the measurement table display processing unit 245 searches the FAI table display area SG2 for the dimension addition tag of the clicked dimension. Subsequently, the measurement table display processing unit 245 can scroll to the corresponding location in the FAI table display area SG2 and perform the markup(s) (block S809). For example, in situations in which the dimension addition tag of, "*[1-2]," in the drawing display area SG1 is clicked and selected in FIG. 15, the measurement table display processing unit 245 performs the markup(s) such as changing the display color, as shown in the mark MK3 in the FAI table display area SG2. After the process of block S809, the measurement table display processing unit 245 ends the process.

Although the above description in FIGS. 14 and 15 are made as a processing of the inspection management device 2 owned by the supplier S1, the same processing may be performed on a inspection support device 1 owned by the designer D1. Here, the measurement table display processing unit 145 of the inspection support device 1 can performs the same processing as the measurement table display processing unit 245.

As described above, the inspection support device 1 according to various embodiments include the attribute addition processing unit 142, the numbering processing unit 143, and the measurement table generation unit 144. The attribute addition processing unit 142 adds a dimension attribute (or attribute information) of the dimension value and a delimiter for identifying the number information of the dimension value (e.g., "[," "–," or "]") to a dimension value of the measurement target included in drawing data. The numbering processing unit 143 adds number information to the delimiter, in which the number information includes the drawing sheet number and the dimension number of the measurement target. The measurement table generation unit 144 generates a measurement table containing target identification information (or dimension addition tag) indicating the measurement target corresponding to the drawing data and inspection standards, on the basis of the dimension addition tag (or dimension addition information), in which the dimension attribute is associated with the number information added to the delimiter, and based on the dimension values of the measurement target.

Accordingly, the inspection support device 1 according to various embodiments is able to automatically number the dimensions and/or automatically generate a FAI table (e.g., a measurement table). Therefore, for example, because the inspection support device 1 can provide the supplier S1 with a drawing and a FAI table (e.g., measurement table), the supplier S1 does not have to manually create the FAI table (e.g., measurement table) from the drawing. Moreover, the inspection support device 1 according to various embodiments is able to provide a plurality of suppliers S1 with FAI tables that include a common format and/or common numbering. Therefore, when confirming the measurement result on the designer D1 side, the measurement result can be confirmed relatively easily and/or the man-hours utilized for inspecting a part can be reduced. Thus, the inspection support device 1 according to various embodiments is able to increase the convenience of inspection work.

Furthermore, the inspection support device 1 according to various embodiments can assign the dimension number for each sheet number, and therefore, a dimension number is able to be added and/or deleted for each sheet, thereby enabling a further increase in convenience. Moreover, the inspection support device 1 according to various embodiments can add a dimension attribute (or attribute information) to a dimension, by which measurement points can be flexibly extracted and numbered according to the purpose of measurement and can make it possible to determine the presence or absence of measurement and/or to make confirmation for each attribute (or measurement purpose) such as, for example, an important measurement item.

Further still, in various embodiments, the inspection standards include the dimension value of the measurement target and the tolerance of the dimension value. In situations in which a tolerance is added to the dimension value of the measurement target in the drawing data, the measurement table generation unit 144 generates a measurement table using the added tolerance. Thus, the inspection support device 1 according to various embodiments is able to add an arbitrary tolerance to the dimension, which enables an increase in the degree of freedom.

Further yet, the inspection support device 1 according to various embodiments can include a tolerance storage unit that stores the range of a dimension value and a tolerance in association with each other. In situations in which a tolerance is not added to the dimension value of the measurement target in drawing data, the measurement table generation unit 144 acquires the tolerance corresponding to the dimension value of the measurement target from the tolerance storage unit and generates a measurement table by using the acquired tolerance. Thus, the inspection support device 1 according to various embodiments is able to automatically set an appropriate tolerance according to the range of the dimension value in situations in which a tolerance is not added to the dimension.

In various embodiments, the numbering processing unit 143 adds number information, which is given by one of a first process, a second process, and a third process, to a delimiter. As the first process, the numbering processing unit 143 provides the number information in the order of the dimensions of the specified measurement target on the drawing displayed on the display unit. As the second process, the numbering processing unit 143 provides the number information in a predetermined order based on the position of the dimension on the drawing displayed on the display unit 12. As the third process, the numbering processing unit 143 provides number information to the drawing displayed on the display unit in the order of adding delimiters. Thus, the inspection support device 1 according to various embodiments is able to increase the degree of freedom of the numbering process, thereby enabling a selection of a numbering method, by which the convenience can be further increased.

The inspection support device 1 according to various embodiments enables the definition of the numbering order of dimension numbers in an arbitrary manner, thereby increasing visibility and searchability. Therefore, the inspection support device 1 according to various embodiments is able to flexibly perform the numbering process with a combination of the first, second, and/or third processes.

In various embodiments, in situations in which the dimension number is greater than or equal to the specified dimension number, the numbering processing unit 143 performs a shift process of shifting the dimension number by changing the dimension number to a value obtained by adding the specified number of shifts to the dimension number. Thus, the inspection support device 1 according to various embodiments is able to shift the dimension number, by which the dimension number can be easily added in the middle. The inspection support device 1 according to various embodiments is able to flexibly perform a numbering process, for example, in changing a drawing, adding a measurement dimension, and/or the like.

Furthermore, in various embodiments, the target identification information (or dimension addition tag) includes a dimension attribute (or attribute information) and number information. The measurement table generation unit 144 generates a measurement table including a dimension attribute (or attribute information), number information, and inspection standards for each measurement target. The dimension attribute (or attribute information) includes importance information indicating the importance of measurement or management specification information indicating a measurement target for which the process capability index is calculated. Thus, the inspection support device 1 according to various embodiments is able to classify and manage the measurement items by adding dimension attributes (or attribute information) such as, for example, an important dimension ("*") and a target dimension ("@") of the process capability index Cpk. Furthermore, the inspection support device 1 according to various embodiments is able to filter a dimension attribute according to a dimensional element, a sheet number, the presence or absence of a specified tolerance, and/or the like, which makes it easier to extract or list the important dimensions.

Further still, the inspection support device 1 according to various embodiments includes the measurement table display processing unit 145 (or display processing unit). The measurement table display processing unit 145 displays a drawing indicated by drawing data and a FAI table (or measurement table) generated by the measurement table generation unit 144 on the display unit, visibly displays the positions of target identification information (or dimension addition tag) and inspection standards in the measurement table corresponding to the dimension of the measurement target specified in the drawing, and visibly displays the position of the measurement target dimension in the drawing corresponding to the target identification information (or dimension addition tag) and inspection standards specified in the FAI table (or measurement table). Thus, the inspection support device 1 according to various embodiments is able to mutually confirm the positions of the dimension in the drawing and in the FAI table (or measurement table) and is able to compare the drawing with the FAI table (or measurement table) during confirmation, thereby further increasing the convenience in confirming the inspection result (or measurement result).

Further yet, the inspection support system 100 according to various embodiments includes the above-mentioned inspection support device 1 and the inspection management device 2. The inspection management device 2 includes the above-mentioned measurement table display processing unit 245 (or display processing unit). Thus, the inspection support system 100 according to various embodiments can include the same effect as the inspection support device 1 described elsewhere herein and may be able to increase the convenience in inspection work. Furthermore, the inspection support system 100 according to various embodiments is able to mutually confirm the positions of the dimension in the drawing and the dimension in the FAI table (or measurement table) and is able to confirm the positions by comparing the drawing with the FAI table (or measurement table).

In various embodiments, the inspection management device 2 includes: an input processing unit 243 that adds a measured value of the dimension of the measurement target, which has been input from the input unit 11, to the measurement table, and a result determination unit 244 (or determination processing unit) that determines an inspection result of the dimension of the measurement target on the basis of the inspection standards in the measurement table with the measured value added by the input processing unit 243 and based on the measured value. Thus, the inspection support system 100 according to various embodiments is able to enter the measured value in the generated FAI table (or measurement table) and to determine the measured value.

In addition, the inspection support method according to various embodiments includes an attribute addition process block, a numbering process block, and a measurement table generation block. In the attribute addition process block, the attribute addition processing unit 142 adds a dimension attribute (or attribute information) of a dimension value of a measurement target included in drawing data and a delimiter for identifying number information of the dimension value to the dimension value. In the numbering process block, the numbering processing unit 143 adds the number information to the delimiter, in which the number information includes a drawing sheet number and a dimension number of the measurement target. In the measurement table generation block, the measurement table generation unit 144 generates a measurement table containing target identification information (or dimension addition tag) indicating the measurement target corresponding to the drawing data and inspection standards, based on a dimension addition tag, in which the attribute information is associated with the number information added to the delimiter and based on the dimension value of the measurement target. Thus, the inspection support method according to various embodiments can include the same effect as the inspection support device 1 described elsewhere herein and enable an increase in the convenience in inspection work.

Furthermore, a data structure according to various embodiments, which is a data structure indicating dimensions included in drawing data, includes location information in a drawing representing a measurement target, a dimension value of the measurement target, attribute information of the dimension value, and number information of the dimension value. The number information of the dimension value, which is number information of the dimension value with a delimiter added for identifying the number information of the dimension value, includes a drawing sheet number and a dimension number of the measurement target. Thus, the data structure according to various embodiments can include the same effect as the inspection support device 1 described elsewhere herein and enable an increase in the convenience in inspection work. The various embodiments are not limited to the embodiments specifically described herein and can be modified without departing from the spirit of the various embodiments. For example, in various embodiments, the inspection support device 1 may include an input processing unit 243, a result determination unit 244, and a measurement table display processing unit 245 similar to those of the inspection management device 2.

Further, although the various embodiments have been described via an example in which the input processing unit 243 acquires a measured value from the input unit 21, the various embodiments are not limited thereto. For example, a measured value measured by a measuring device may be directly acquired and/or via a network.

Moreover, in various embodiments, the inspection support device 1 and the inspection management device 2 may be connected by a network to transmit and/or receive drawing data and a FAI table to and/or from each other via the network. Furthermore, although the inspection support system 100 has been described via an example that applies the inspection support system 100 to 2D drawing data in the various embodiments, the various embodiments are not limited thereto, and the inspection support system 100 may be applied to 3D (three-dimensional) drawing data.

Each component of the inspection support system 100 described above includes a computer system therein. In addition, processing in each component included in the above inspection support system 100 may be performed by recording a program for implementing the function of each component of the inspection support system 100 described above on a computer-readable recording medium, causing the computer system to read and execute the program recorded on the recording medium, where "causing the computer system to read and/or execute the program recorded on the recording medium" includes installing the program on the computer system. The "computer system" here may include hardware, such as an OS and/or one or more peripheral devices.

Further, the "computer system" may include a plurality of computer devices connected via a network including a communication line such as the Internet, a WAN, a LAN, and/or a dedicated line. Moreover, a "computer-readable recording medium" can mean a portable medium, such as a flexible disk, a magneto-optical disk, a ROM, or a CD-ROM, or can mean a storage device such as a hard disk built in a computer system. In this manner, the recording medium in which the program is stored may be a non-transitory recording medium, such as a CD-ROM among other non-transitory mediums that are possible and contemplated herein.

The recording medium can also include an internal or external recording medium that can be accessed from a distribution server to distribute the program. Note that the program may be divided into multiple parts, downloaded at different times, and then combined with each other in a configuration of the inspection support system 100, or there may be different distribution servers that distribute the respective divided programs. Furthermore, the "computer-readable recording medium" may include a recording medium that holds a program for a certain period of time such as a volatile memory (RAM) inside a computer system that serves as a server or a client in the case where a program is transmitted via a network. In addition, the above program may be used to implement some of the above-mentioned functions. Furthermore, the program may be a so-called difference file (or difference program) that is capable of implementing the above functions in combination with a program already recorded in the computer system.

In addition, some or all of the above functions may be implemented as a large-scale integration (LSI) or other integrated circuit. Each of the above functions may be integrated into a processor individually, or some or all of the functions may be integrated into a processor. Furthermore, the integrated circuit method is not limited to an LSI, but may be implemented by a dedicated circuit or a general-purpose processor. Moreover, if an integrated circuit technology that replaces LSI appears due to advances in semiconductor technology, an integrated circuit based on such technology may be used.

Further, embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claim is:

1. An apparatus, comprising:
an attribute addition processor that:
identifies a dimension value of a dimension for a measurement target included in drawing data of a drawing sheet,
identifies a drawing sheet value for the drawing sheet, wherein the drawing sheet value represents a drawing sheet number, and
identifies a delimiter for increasing visibility of the drawing sheet value and the dimension value in a display;
a numbering processor that generates a set of values by adding the drawing sheet value and the dimension value and including the delimiter to be displayed between the drawing sheet value and the dimension value such that the delimiter separates the drawing sheet value and the dimension value in the set of values;
a measurement table generation processor that generates the measurement table, wherein the measurement table includes target identification information and incorporates flexibility to the dimension value for the measurement target; and
a measurement table output processor that displays the drawing sheet value and the dimension value on the measurement table by displaying the delimiter between the drawing sheet value and the dimension value on the measurement table to separate the drawing sheet value from the dimension value.

2. The apparatus of claim 1, wherein:
the measurement table generation processor generates the measurement table utilizing an added tolerance; and
the tolerance is added to the dimension value of the measurement target in the drawing data.

3. The apparatus of claim 2, further comprising:
a tolerance storage processor that stores a range of the dimension value and the tolerance in association with each other,
wherein the measurement table generation processor is further configured to:
acquire the tolerance corresponding to the dimension value of the measurement target from the tolerance storage processor in which the tolerance is not added to the dimension value of the measurement target in the drawing data, and
generate the measurement table using the acquired tolerance.

4. The apparatus of claim 1, wherein:
the numbering processor adds the dimension value to the delimiter; and
the dimension value is provided by one of:
a first process of providing the dimension value in an order of dimensions of the measurement target specified on the drawing displayed on a display unit,
a second process of providing the dimension value in a predetermined order based on a position of the dimension on the drawing sheet displayed on the display unit, and
a third process of providing the dimension value in an order in which the delimiter is added to the drawing sheet displayed on the display unit.

5. The apparatus of claim 1, wherein the numbering processor is configured to perform a shift process for shifting the dimension value by changing the dimension value to a value obtained by adding a specified number of shifts to the dimension value in which the dimension value is greater than or equal to a specified dimension value.

6. The apparatus of claim 1, wherein:
the target identification information includes the dimension and the dimension value; and
the measurement table generation processor generates the measurement table including the dimension and the dimension value.

7. The apparatus of claim 1, wherein the dimension includes importance information indicating an importance of measurement or management specification information indicating the measurement target for which a process capability index is calculated.

8. The apparatus of claim 1, further comprising:
a display that:
displays a drawing indicated by the drawing data and the measurement table generated by the measurement table generation processor on the display,
displays positions of the target identification information on the measurement table corresponding to the dimension of the measurement target specified in the drawing, and
displays a position of the dimension of the measurement target in the drawing corresponding to the target identification information specified in the measurement table.

9. A system, comprising:
a display device;
a processor coupled to the display device; and
a memory device coupled to the processor, wherein the memory device is configured to store code that, when executed by processor causes the processor to:
identify a dimension value of a dimension for a measurement target included in drawing data of a drawing sheet,
identify a drawing sheet value for the drawing sheet, wherein the drawing sheet value represents the drawing sheet number,
identify a delimiter for increasing visibility of the drawing sheet value and the dimension value in a display,
generate a set of values by adding the drawing sheet value and the dimension value and including the delimiter to be displayed between the drawing sheet value and the dimension value such that the delimiter separates the drawing sheet value and the dimension value in the set of values,
generate the measurement table, wherein the measurement table includes target identification information and incorporates flexibility to the dimension value for the measurement target, and
display the drawing sheet value and the dimension value on the measurement table by displaying the delimiter between the drawing sheet value and the dimension value on the measurement table to separate the drawing sheet value from the dimension value.

10. The system of claim 9, wherein:
the measurement table is generated utilizing an added tolerance; and
the tolerance is added to the dimension value of the measurement target in the drawing data.

11. The system of claim 10, wherein:
the memory device is further configured to store a range of the dimension value and the tolerance in association with each other; and
the processor is further configured to:
acquire the tolerance corresponding to the dimension value of the measurement target from the memory device in which the tolerance is not added to the dimension value of the measurement target in the drawing data, and
generate the measurement table using the acquired tolerance.

12. The system of claim 9, wherein:
the processor is further configured to add the dimension value to the delimiter; and
the dimension value is provided by one of:
  a first process of providing the dimension value in an order of dimensions of the measurement target specified on the drawing displayed on the display device,
  a second process of providing the dimension value in a predetermined order based on a position of the dimension on the drawing displayed on the display device, and
  a third process of providing the dimension value in an order in which the delimiter is added to the drawing displayed on the display device.

13. The system of claim 9, wherein the processor is further configured to perform a shift process for shifting the dimension value by changing the dimension value to a value obtained by adding a specified number of shifts to the dimension in which the dimension value is greater than or equal to a specified dimension value.

14. The system of claim 9, wherein:
the target identification information includes the dimension and the dimension value; and
the processor generates the measurement table including the dimension and the dimension value.

15. The system of claim 9, wherein the dimension includes importance information indicating an importance of measurement or management specification information indicating the measurement target for which a process capability index is calculated.

16. The system of claim 9, wherein:
the processor is further configured to display on the display device:
  a drawing indicated by the drawing data and the measurement table generated by the measurement table generation unit on the display device,
  positions of the target identification information on the measurement table corresponding to the dimension of the measurement target specified in the drawing, and
  a position of the dimension of the measurement target in the drawing corresponding to the target identification information specified in the measurement table.

17. A method, comprising:
identifying, by an attribute addition processor, a dimension value of a dimension for a measurement target included in drawing data of a data sheet;
identifying, by the attribute addition processor, a drawing sheet value for the drawing sheet, wherein the drawing sheet value represents the drawing sheet number;
identifying, by the attribute addition processor, a delimiter for increasing visibility of the drawing sheet value and the dimension value in a display;
generating, by a numbering processor, a set of values by adding the drawing sheet value and the dimension value to the set of values such that and including the delimiter to be displayed between the drawing sheet value and the dimension value such that the delimiter separates the drawing sheet value and the dimension value in the set of values;
generating, by a measurement table generation processor, the measurement table, wherein the measurement table includes target identification information and incorporates flexibility to the dimension value for the measurement target; and
displaying, by a measurement table output processor, the drawing sheet value and the dimension value on the measurement table by displaying the delimiter at the location between the drawing sheet value and the dimension value on the measurement table to separate the drawing sheet value from the dimension value.

18. The method of claim 17, further comprising:
storing, by a tolerance storage processor, a range of the dimension value and the tolerance in association with each other; and
acquiring, by the measurement table generation processor, the tolerance corresponding to the dimension value of the measurement target from the tolerance storage processor in which the tolerance is not added to the dimension value of the measurement target in the drawing data,
wherein the measurement table is generated using the acquired tolerance.

19. The method of claim 17, further comprising:
adding, by the numbering processor, the dimension value to the delimiter,
wherein the dimension value is provided by one of:
  providing, via a first process, the dimension value in an order of dimensions of the measurement target specified on the drawing displayed on a display device,
  providing, via a second process, the dimension value in a predetermined order based on a position of the dimension on the drawing displayed on the display device, and
  providing, via a third process, the dimension value in an order in which the delimiter is added to the drawing displayed on the display device.

20. The method of claim 17, further comprising:
performing, by the numbering processor, a shift process for shifting the dimension value by changing the dimension value to a value obtained by adding a specified number of shifts to the dimension value in which the dimension value is greater than or equal to a specified dimension value.

* * * * *